(12) United States Patent
Najafi et al.

(10) Patent No.: US 11,475,288 B2
(45) Date of Patent: Oct. 18, 2022

(54) SORTING NETWORKS USING UNARY PROCESSING

(71) Applicant: Regents of the University of Minnesota, Minneapolis, MN (US)

(72) Inventors: Mohammadhassan Najafi, Lafayette, LA (US); David J. Lilja, Maplewood, MN (US); Marcus Riedel, Shorewood, MN (US); Kiarash Bazargan, Plymouth, MN (US)

(73) Assignee: Regents of the University of Minnesota, Minneapolis, MN (US)

( * ) Notice: Subject to any disclaimer, the term of this patent is extended or adjusted under 35 U.S.C. 154(b) by 577 days.

(21) Appl. No.: 16/674,488

(22) Filed: Nov. 5, 2019

(65) Prior Publication Data
US 2020/0143234 A1 May 7, 2020

Related U.S. Application Data

(60) Provisional application No. 62/755,906, filed on Nov. 5, 2018.

(51) Int. Cl.
| | |
|---|---|
| *G06N 3/063* | (2006.01) |
| *G06F 7/20* | (2006.01) |
| *G06F 7/24* | (2006.01) |
| *H03M 1/50* | (2006.01) |

(52) U.S. Cl.
CPC ............. *G06N 3/0635* (2013.01); *G06F 7/20* (2013.01); *G06F 7/24* (2013.01); *H03M 1/504* (2013.01)

(58) Field of Classification Search
CPC ........ G06N 3/0635; G06N 20/20; G06F 7/20; G06F 7/24; G06F 2207/4824; H03M 1/504

USPC ......................................................... 706/36
See application file for complete search history.

(56) References Cited

U.S. PATENT DOCUMENTS

| | | | |
|---|---|---|---|
| 10,063,255 B2 | 8/2018 | Reidel et al. | |
| 10,520,975 B2 * | 12/2019 | Lilja | .......................... G06T 1/00 |
| 2018/0204131 A1 | 7/2018 | Najafi et al. | |
| 2019/0121839 A1 | 4/2019 | Mohajer et al. | |
| 2019/0149166 A1 | 5/2019 | Mohajer et al. | |
| 2019/0289345 A1 | 9/2019 | Najafi | |

OTHER PUBLICATIONS

Alaghi et al., "Trading Accuracy for Energy in Stochastic Circuit Design," ACM Journal of Emerging Technologies in Computing Systems, vol. 13, No. 3, Article 47, Apr. 2017, 30 pp.

(Continued)

*Primary Examiner* — Tan V Mai
(74) *Attorney, Agent, or Firm* — Shumaker & Sieffert, P.A.

(57) ABSTRACT

Various implementations of sorting networks are described that utilize time-encoded data signals having encoded values. In some examples, an electrical circuit device includes a sorting network configured to receive a plurality of time-encoded signals. Each time-encoded signal of the plurality of time-encoded signals encodes a data value based on a duty cycle of the respective time-encoded signal or based on a proportion of data bits in the respective time-encoded signal that are high relative to the total data bits in the respective time-encoded signal. The sorting network is also configured to sort the plurality of time-encoded signals based on the encoded data values of the plurality of time-encoded signals.

20 Claims, 15 Drawing Sheets

(56) References Cited

OTHER PUBLICATIONS

Alaghi et al., "Exploiting Correlation in Stochastic Circuit Design," 2013 IEEE 31st International Conference on Computer Design (ICCD), Oct. 6-9, 2013, 8 pp.

Li et al., "Using Stochastic Computing to Reduce the Hardware Requirements for a Restricted Boltzmann Machine Classifier," Proceedings of the 2016 ACM/SIGDA International Symposium on Field-Programmable Gate Arrays, FPGA'16, Feb. 2016, 6 pp.

Batcher, "Sorting networks and their applications," Proceedings of the Apr. 30-May 2, 1968, Spring Joint Computer Conference, AFIPS'68, Apr. 1968, 8 pp.

Chakrabarti, "Sorting Network Based Architectures for Median Filters," Semantic Scholar, IEEE Transactions on Circuits and Systems II: Analog and Digital Signal Processing, vol. 40, Nov. 1993, 12 pp.

Jenson et al., "A Deterministic Approach to Stochastic Computation," Proceedings of the 35th International Conference on Computer-Aided Design, ICCAD'16, Article No. 102, Nov. 2016, 8 pp.

Najafi et al., "Polysynchronous Clocking: Exploiting the Skew Tolerance of Stochastic Circuits," IEEE Transactions on Computers, vol. 66, No. 10, Oct. 2017, 13 pp.

Najafi et al., "Time-Encoded Values for Highly Efficient Stochastic Circuits," IEEE Transactions on Very Large Scale Integration (VLSI) Systems, vol. 25, No. 5, May 2017, 14 pp.

Poppelbaum et al., "Stochastic computing elements and systems," Proceedings of the Nov. 14-16, 1967 Fall Joint Computer Conference, AFIPS'67, Nov. 1967, 10 pp.

Qian et al., "The Synthesis of Robust Polynomial Arithmetic with Stochastic Logic," Proceedings of the 45th annual Design Automation Conference, DAC'08, Jun. 2008, 6 pp.

Qian et al., "An Architecture for Fault-Tolerant Computation with Stochastic Logic," IEEE Transactions on Computers, vol. 60, No. 1, Feb. 2011, 13 pp.

Najafi et al., "Low-Cost Sorting Network Circuits Using Unary Processing," IEEE Transactions on Very Large Scale Integration (VLSI) Systems, vol. 46, No. 8, Aug. 2018, 10 pp.

Baddar et al., "Bitonic sort on a chained-cubic tree interconnection network," Journal of Parallel and Distributed Computing, vol. 74, Sep. 2013, 18 pp.

Maghi et al., "Survey of Stochastic Computing," ACM Transactions on Embedded Computing Systems, vol. 12, No. 2, Article 92, May 2013, 19 pp.

Alaghi et al., "Stochastic Circuits for Real-Time Image-Processing Applications," Proceedings of the 50th Annual Design Automation Conference, DAC'13, May 2013, 6 pp.

Chakrabarti et al., "Novel Sorting Network-Based Architectures for Rank Order Filters," IEEE Transactions on Very Large Scale Integration (VLSI) Systems, vol. 2, No. 4, Dec. 1994, 20 pp.

Cushon et al., "A Min-Sum Iterative Decoder Based on Pulsewidth Message Encoding," IEEE Transactions on Circuits and Systems-II: Express Briefs, vol. 57, No. 11, Nov. 2010, 6 pp.

Farahani et al., "Modular Design of High-Throughput, Low-Latency Sorting Units," IEEE Transactions on Computers, vol. 62, No. 7, Jul. 2013, 14 pp.

Govindaraju et al., "GPUTeraSort: High Performance Graphics Co-processor Sorting for Large Database Management," Proceedings of the 2006 ACM SIGMOD international conference on Management of Data, Jun. 2006, 12 pp.

Graefe, "Implementing Sorting in Database Systems," ACM Computing Surveys, vol. 38, No. 3, Article 10, Sep. 2006, 37 pp.

Karaman et al., "Design and Implementation of a General-Purpose Median Filter Unit in CMOS VLSI," IEEE Journal of Solid-State Circuits, vol. 25, No. 2, Apr. 1990, 9 pp.

Kuo et al., "Design and Analysis of Defect Tolerant Hierarchical Sorting Networks," IEEE Transactions on Very Large Scale Integration (VLSI) Systems, vol. 1, No. 2, Jun. 1993, 5 pp.

Najafi et al., "High-speed stochastic circuits using synchronous analog pules," Proceedings in the 22nd Asia and South Pacific Design Automation Conference (ASP-DAC), Jan. 2017.

Najafi et al., "Power and Area Efficient Sorting Networks using Unary Processing," Proceedings in 35th IEEE International Conference on Computer Design (ICCD), Nov. 2017, 4 pp.

Najafi et al., "A Fast Fault-Tolerant Architecture for Sauvola Local image Thresholding Algorithm Using Stochastic Computing," IEEE Transactions on Very Large Scale Integration (VLSI) Systems, vol. 24, No. 2, Feb. 2016, 5 pp.

Gaines, "Stochastic Computing Systems, Chapter 2," Advances in Information Systems Sciences, Springer, US, (Applicant points out, in accordance with MPEP 609.04(a), that the year of publication, 1969, is sufficiently earlier than the effective U.S. filing date, so that the particular month of publication is not in issue.), 69 pp.

Najafi, "High-Speed Stochastic Circuits Using Synchronous Analog Pulses," Proc. 22nd Asia and South Pacific Design Automation Conference, Feb. 2017, pp. 481-487.

Li et al., "Computation on Stochastic Bit Streams Digital Image Processing Case Studies," IEEE Transactions on Very Large Scale Integration (VLSI) Systems, vol. 22, Issue 3, Mar. 2014, available from IEEE Apr. 15, 2013, 14 pp.

Brown et al., "Stochastic Neural Computation I: Computational Elements," IEEE Transactions on Computers, vol. 50, Issue 9, Sep. 2001, 15 pp.

Farmahini-Farahani, "Modular Design of High-Throughput, Low-Latency Sorting Units," Electrical and Computer Engineering department of the University of Wisconsin-Madison, (Applicant points out, in accordance with MPEP 309.04(a), that the year of publication, 2012, is sufficiently earlier than the effective U.S. filing date, so that the particular month of publication is not in issue.), 76 pp.

Agrawal, "Arbitrary Size Bitonic (ASB) Sorters and Their Applications in Broadband ATM Switching," Proceedings of IEEE 15th Annual Int. Phoenix Conf. Comput Commun., Mar. 1996, pp. 454-458.

Brajovic et al., "A VLSI Sorting Image Sensor: Global Massively Parallel Intensity-to-Time Processing for Low-Latency Adaptive Vision," IEEE Transactions on Robotics and Automation, vol. 15, No. 1, Feb. 1999, pp. 67-75.

Brown et al., "Stochastic Neural Computation II: Soft Competitive Learning," IEEE Transactions on Computers, vol. 50, No. 9, Sep. 2001, pp. 906-920.

Chen et al., "Computer Generation of High Throughput and Memory Efficient Sorting Designs on FPGA," IEEE Transactions on Parallel and Distributed Systems, vol. 28, No. 11, Nov. 2017, pp. 3100-3113.

Colavita et al., "A novel sorting algorithm and its application to a gamma-ray telescope asynchronous data acquisition system," Nuclear Instruments and Methods in Physics Research. Section A: Accel., Spectrometers, Detectors Associated Equip., vol. 394, No. 3, Feb. 26, 1997, pp. 374-380.

Colavita et al., "SORTCHIP: A VLSI Implementation of a Hardware Algorithm for Continuous Data Sorting," IEEE Journal of Solid-State Circuits, vol. 38, No. 6, Jun. 2003, pp. 1076-1079.

Gedik et al., "CELLSORT: High Performance Sorting on the Cell Processor," Proc. 33rd Int. Conf. Very Large Data Bases (VLDB), 2007, pp. 1286-1297.

Mahafzah et al., "Performance assessment of multithreaded quicksort algorithm on simultaneous multithreaded architecture," J. Supercomput., vol. 66, No. 1, Mar. 19, 2013, pp. 339-363.

Ravinuthula et al., "Time-mode circuits for analog computation," International Journal of Circuit Theory and Applications, vol. 37, No. 5, Apr. 11, 2008, pp. 631-659.

Eklund et al., "VLSI Implementation of a Focal Plane Image Processor—A Realization of the Near-Sensor Image Processing Concept," IEEE Transactions on Very Large Scale Integration (VLSI) Systems, vol. 4, No. 3, Sep. 1996, pp. 332-335.

Guo et al., "Energy-efficient hybrid analog/digital approximate computation in continuous time," IEEE Journal of Solid-State Circuits, vol. 51, No. 7, Jul. 2016, pp. 1514-1524.

Kantawala, "Design, analysis, and evaluation of concurrent checking sorting networks," IEEE Transactions on Very Large Scale Integration (VLSI) Systems, vol. 5, No. 3, Sep. 1997, pp. 338-343.

Nikahd et al. "High-speed hardware implementation of fixed and runtime variable window length 1-D median filters," IEEE Transactions on Circuits and Systems-II: Express Briefs, vol. 63, No. 5, May 2016, pp. 478-482.

(56) References Cited

OTHER PUBLICATIONS

Pok et al., "Chip Design for Monobit Receiver," IEEE Transactions on Microwave Theory and Techniques, vol. 45, No. 12, Dec. 1997, pp. 2283-2295.
Richards, "VLSI Median Filters," IEEE Transactions on Acoustics, Speech, and Signal Processing, vol. 38, No. 1, Jan. 1990, pp. 145-153.
Scott, "Analysis of Two-Dimensional Median Filter Hardware Implementations for Real-Time Video Denoising," M.S. thesis, Department of Computer Science Engineering., Pennsylvania State Univ., State College, PA, USA, Dec. 2010, 97 pp.
Stephens et al., "Implementing Scheduling Algorithms in High-Speed Networks," IEEE Journal on Selected Areas in Communications, vol. 17, No. 6, Jun. 1999, pp. 1145-1158.
Tsividis, "Continuous-time digital signal processing," Electronic Letters, vol. 39, No. 21, Oct. 2003, pp. 1551-1552.
Poppelbaum et al., "Unary Processing," Academic Press, Inc., Advances in Computers, vol. 26, (Applicant points but, in accordance with MPEP 609.04(a), that the year of publication, 1987, is sufficiently earlier than the effective U.S. filing date, so that the particular month of publication is not in issue.), pp. 47-92.
Poppelbaum et al., "Burst Processing—A Deterministic Counterpart to Stochastic Computing," Proc. 1st Int. Symp. Stochastic Comput. Appl., (Applicant points out, in accordance with MPEP 609.04(a), that the year of publication, 1978, is sufficiently earlier than the effective U.S. filing date, so that the particular month of publication is not in issue ), pp. 1-30.
Sansen, "Analog Design Essentials—Chapter 19," The International Series in Engineering and Computer Science, vol. 859, 1st Edition, Springer, (Applicant points out, in accordance with MPEP 609.04(a), that the year of publication, 2006, is sufficiently earlier than the effective U.S. filing date, so that the particular month of publication is not in issue.), pp. 567-602.

\* cited by examiner

SORTING NETWORKS USING UNARY PROCESSING

This application claims the benefit of U.S. Provisional Patent Application No. 62/755,906 (filed Nov. 5, 2018), the entire content being incorporated herein by reference.

GOVERNMENT INTEREST

This invention was made with government support under CCF-1408123 awarded by National Science Foundation. The government has certain rights in the invention.

BACKGROUND

Stochastic computing (SC) is a low-cost noise-tolerant computing paradigm. In many stochastic computing systems, logical computation is performed on probability data in the [0, 1] interval. In some SC systems, the data is represented by bit-streams (e.g. uniformly distributed (random) bit-streams or pseudorandom bit-streams). In general, the ratio of the number of ones to the length of a given data unit (e.g., word) in the bitstream determines the value of the data unit. For example, a data unit of 1101011100 in the bit-stream may be used as a representation of 0.6 in the stochastic domain.

SUMMARY

In general, this disclosure describes various implementations of sorting networks using time-encoded data signals having encoded values. In examples in which a time-encoded signal includes a pulse-width modulated (PWM) signal, the time-encoded signal can encode a numerical value in a duty cycle of the PWM signal. In examples in which a time-encoded signal includes a unary signal, the time-encoded signal can encode a numerical value based on the proportion of data bits that are high relative to the total data bits in the unary signal. In some examples, the sorting network can use circuitry that is much simpler and smaller than the circuitry for conventional binary sorting networks.

The details of one or more aspects of the disclosure are set forth in the accompanying drawings and the description below. Other features, objects, and advantages of the techniques described in this disclosure will be apparent from the description, drawings, and claims.

DETAILED DESCRIPTION

Figure 1:
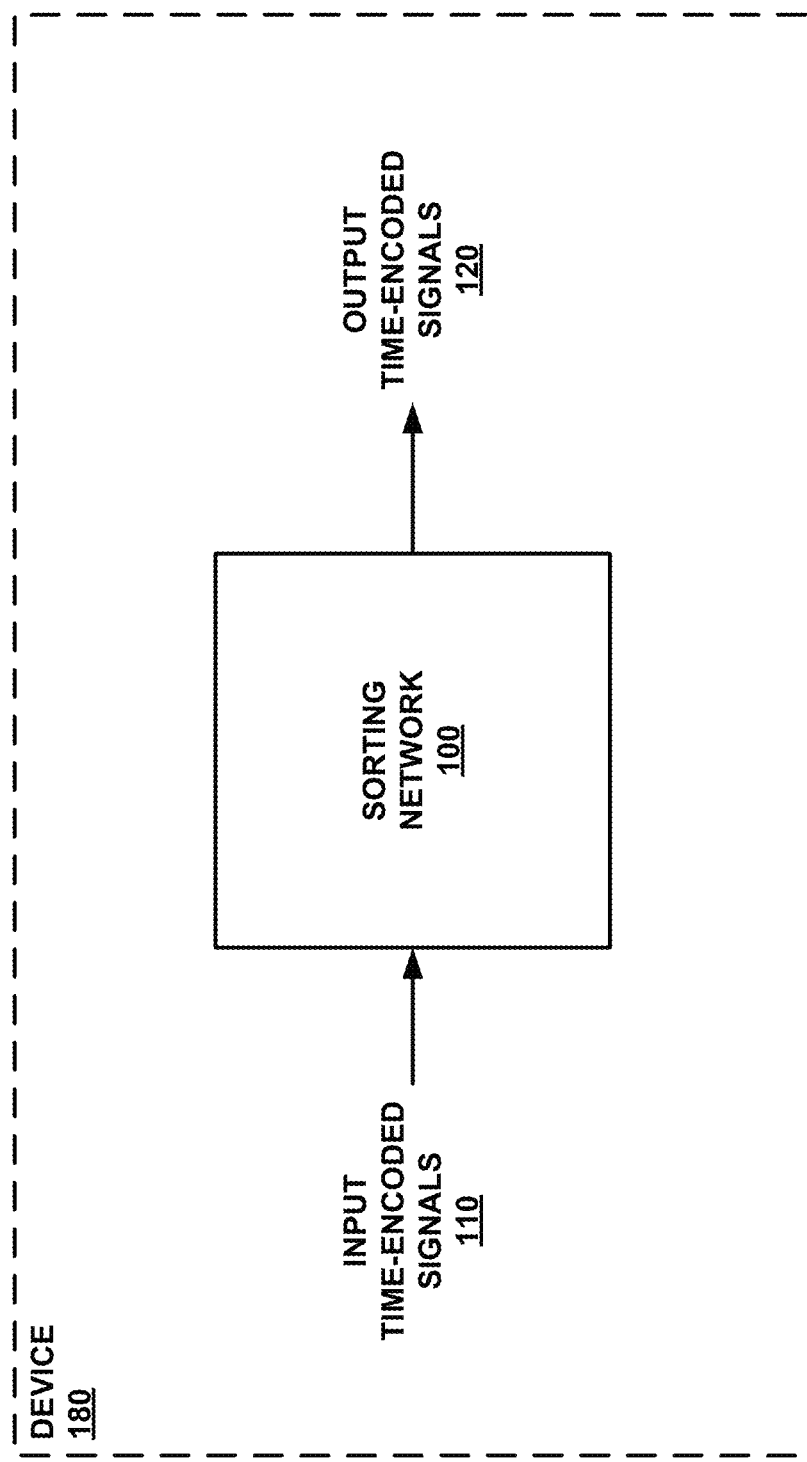
FIG. 1 is a conceptual block diagram of a sorting network that processes time-encoded signals.

In general, various unique area- and power-efficient hardware implementations of sorting network circuits based on "unary processing" are described. As described herein, the various implementations utilize unique time-encoding of data to achieve low-cost, energy-efficient implementations with, in some examples, only minimal or no accuracy loss.

In one or more examples described in this disclosure, input data is encoded as unary serial bit-streams, with values represented by the fraction of 1's in a stream of 0's and 1's. Synthesis results of complete sorting networks show up to 92% area and power saving compared to the binary implementations. Further, as discussed herein, to mitigate the increased latency, this disclosure describes example techniques using time-encoding of data to achieve low-cost, energy-efficient implementations.

The time-encoding techniques described herein can be used for various applications of sorting networks: median filtering, including weighted and adaptive median filters. Moreover, time-encoding the data utilizing the circuits described herein may provide significant improvements in latency and energy consumption as compared with conventional techniques with, in some examples, only slight loss in accuracy.

To mitigate the long latency issue of conventional unary processing, some examples described herein utilize a mixed-signal time-encoding technique. Instead of converting data to (from) binary format using potentially costly analog-to-digital (digital-to-analog) converters and processing in binary domain, the data can, in some examples, be encoded in time using low-cost analog-to-time converters (ATCs) and processed in unary domain. The data can be represented with time-encoded pulse signals. Median filtering can be used for processing time-encoded values. Time-encoding the data may be capable of providing a significant improvement in the latency and energy consumption with only a slight loss in accuracy.

The sorting techniques and circuits described herein may be used in various applications ranging from data mining and databases to image and signal processing. For applications that require high performance, sorting techniques described herein may be performed in hardware-based circuits, such as with ASICs or FPGAs. Moreover, the techniques enable low-cost, power-efficient hardware-based solutions. This disclosure describes novel area- and power efficient approaches to sorting networks based on unary processing. Experimental results from at least some of the implementations suggest up to 92% area and power savings compared to the costs of a conventional weighted binary sorting circuit. Moreover, the designs described herein may exhibit the fault tolerance and low-cost design advantages of stochastic processing while producing completely accurate results. Further, this disclosure describes a noise tolerant, low-cost, and data-width independent architectures that can save the hardware cost of implementing sorting network circuits.

In general, the various hardware-based sorting circuits described herein receive a plurality of data values and output the plurality of data values in a sorted order. The sorted order may arrange the plurality of data values from largest to smallest or vice versa or based on other characteristics. Sorting networks described herein may, for example, include a plurality of compare-and-swap (CAS) blocks, where each CAS block receives two data values and outputs a larger of the two data values and a smaller of the two data values in a predetermined order.

As further described below, sorting networks described herein are, in some examples, designed to operate on time-encoded signals, such as where each data value is encoded in a pulse of each signal. The time-encoded signals may be similar to unary bit streams, where the proportion of data bits that are a certain value represents the data value. Unary bit streams can have a left-flushed format, where all of the ones appear at the beginning of the bit stream. Additional example details of unary signals can be found in commonly assigned U.S. Patent Application Publication No. 2019/0121839, entitled "Parallel Computing Using Stochastic Circuits and Deterministic Shuffling Networks," filed Oct. 19, 2018, commonly assigned U.S. Patent Application Publication No. 2019/0149166, entitled "Computational Devices Using Thermometer Coding and Scaling Networks on Unary Encoded Data," filed Nov. 9, 2018, and commonly assigned U.S. Patent Application Publication No. 2019/0289345, entitled "High Quality Down-Sampling for Deterministic Bit-Stream Computing," filed Mar. 14, 2019, each of which is incorporated herein by reference in its entirety.

Various examples of hardware-based sorting networks are described that operate on time-encoded signals using logic circuitry described herein. For example, in one simple form of logic circuitry, an AND gate can receive two time-encoded signals and output a time-encoded signal with a duty cycle equal to the smaller duty cycle of the two time-encoded signals. As another example, an OR gate can receive the two time-encoded signals and output a time-encoded signal with a duty cycle equal to the larger duty cycle of the two time-encoded signals. In some examples, each time-encoded signal may include a pulse-width modulated (PWM) signal. Additional example details of PWM signals may be found in U.S. Patent Application Publication No. 2018/0204131, filed on Jan. 12, 2018, entitled "Stochastic Computation Using Pulse-Width Modulated Signals," which is incorporated herein by reference in its entirety.

FIG. 1 is a conceptual block diagram of a sorting network 100 that processes time-encoded signals. In some examples, sorting network 100 is a hardware-based circuit implemented as part of device 180, which can be used in applications such as neural networks (e.g., artificial neural networks), accelerator chips, data mining, databases, asynchronous transfer mode (ATM) and communication switching, scientific computing, scheduling, coding, artificial intelligence and robotics, weighted and adaptive median filters, machine learning, autonomous vehicles, unmanned aerial vehicles, and image, video and signal processing. Device 180 may be part of or include one or more integrated circuits, a sensor, an image processor, a video processing circuitry, a camera, a mobile device, or another suitable device.

Sorting network 100 is configured to receive time-encoded signals 110 and output sorted time-encoded signals 120. Each of time-encoded signals 110 and 120 may include a PWM signal, a unary bit stream, a deterministically encoded bit stream, a thermometer encoded bit stream, an edge coded bit stream (e.g., one-hot or one-cold coding), and/or any other type of time-encoding. Additional example details of deterministic computation can be found in commonly assigned U.S. Pat. No. 10,063,255, which issued on Aug. 28, 2018, entitled "Stochastic Computation Using Deterministic Bit Streams," which is incorporated herein by reference in its entirety. In other examples, sorting network 100 need not output sorted signals 120 as time-encoded signals and, instead, may include additional circuitry to convert the sorted time-encoded values to other encoding formats.

In one example, each of time-encoded signals 110 and 120 can encode a numerical value based on the percentage of time that the respective signal has a high value. For example, the duty cycle of each of time-encoded signals 110 and 120 is the amount of time each cycle (e.g., clock cycle) that the respective signal has a high value divided by the total amount of time in the cycle. For digital representations, the "duty cycle" may also refer to the number of data bits that are a high value divided by the total number of data bits. Although this disclosure describes the duty cycle as based on a high value of a signal or a data bit, a low value of the signal or data bit can also be used for determining the duty cycle in some examples.

Sorting network 100 is configured to sort time-encoded signals 110 using the techniques described herein. In some examples, sorting network 100 outputs time-encoded signals 120 as a sorted array of time-encoded signals 110. In other words, sorting network 100 may receive time-encoded signals 110 as a jumbled (e.g., sorted) array of signals. In some examples, sorting network 100 receives N time-encoded signals 110 in parallel at N separate nodes, or sorting network 100 may receive N time-encoded signals 110 in series at a signal node. Sorting network 110 may be configured to sort time-encoded signals 110 from highest to lowest encoded value or from lowest to highest encoded value or other characteristic of the values.

Although not shown in FIG. 1, a thresholding circuit may be configured to receive one or more of time-encoded signals 120 and compare the one or more received signals to a threshold value. For example, the thresholding circuit may receive a median signal (e.g., the second out of three signals) and compare the median signal to a threshold value. Additionally or alternatively, the thresholding circuit may be configured to receive one of time-encoded signals 120 that represents an Xth percentile, where X may be any number between zero and one hundred. The thresholding circuit can include a comparator (e.g., with hysteresis) that receives and compares one or more of time-encoded signals 120 to one or more threshold values. The threshold values can include a signal with a threshold duty cycle such that the thresholding circuit outputs an indication of whether the one or more time-encoded signals 120 have duty cycle(s) that are greater than (or greater than or equal to) the threshold duty cycle.

In one particular example, device 180 is a component circuit of a larger system configured to execute an artificial neural network in which device 180 performs a function, such as a matrix multiply. Further, sorting network 100 can sort time-encoded signals 110 in an efficient manner, which can reduce the size, cost, and power consumption of device 180, possibly at the expense of additional latency, which may be tolerable depending on the application for device 180. As other examples, device 180 can be part of an edge processing system and/or an internet of things system that senses and processes signals and generates outputs based on the processed signals. The efficiency of sorting network 100 may be especially valuable in edge processing and internet of things systems where small, low-cost sensors (e.g., remote cameras, temperature sensors, monitoring units for smart building applications, etc.) are abundant and may each have dedicated, built-in processing circuitry and memory.

Figure 2A:
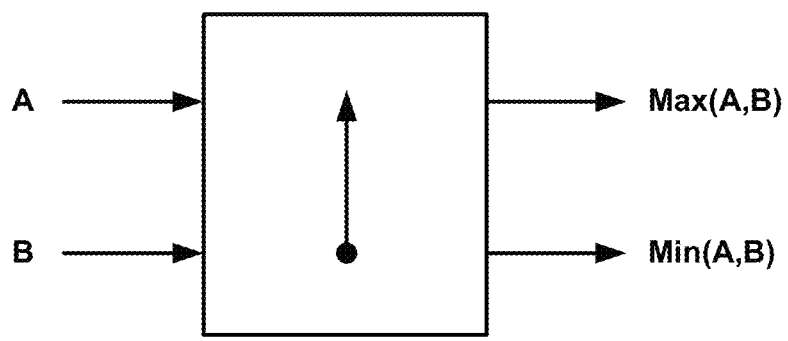
FIGS. 2A and 2B show the schematic symbols for an ascending compare-and-swap (CAS) block and a descending CAS block.
Figure 2B:
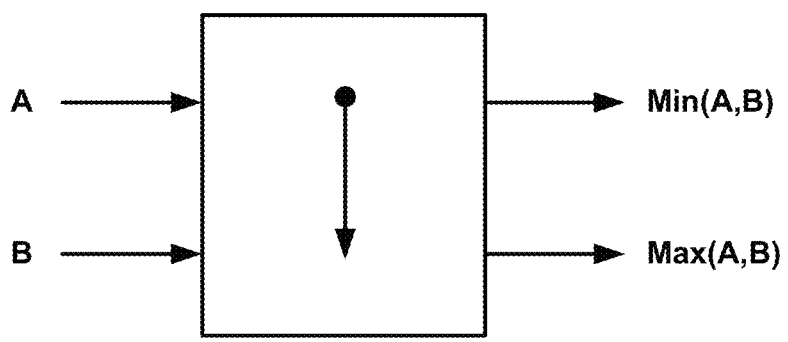

FIGS. 2A and 2B show the schematic symbols for an ascending CAS block 200A and a descending CAS block 200B. A sorting network can include a combination of CAS blocks that sorts a set of input data. Each CAS block may be configured to compare two input values and swaps the values at the output. There are two variants of CAS blocks: 1) an ascending type and 2) a descending type. FIGS. 2A and 2B show the schematic symbols for ascending CAS block 200A and descending CAS block 200B. Each CAS block in the conventional binary design may include an M-bit comparator and two M-bit multiplexers, where M is the data width of the inputs.

Figure 5:
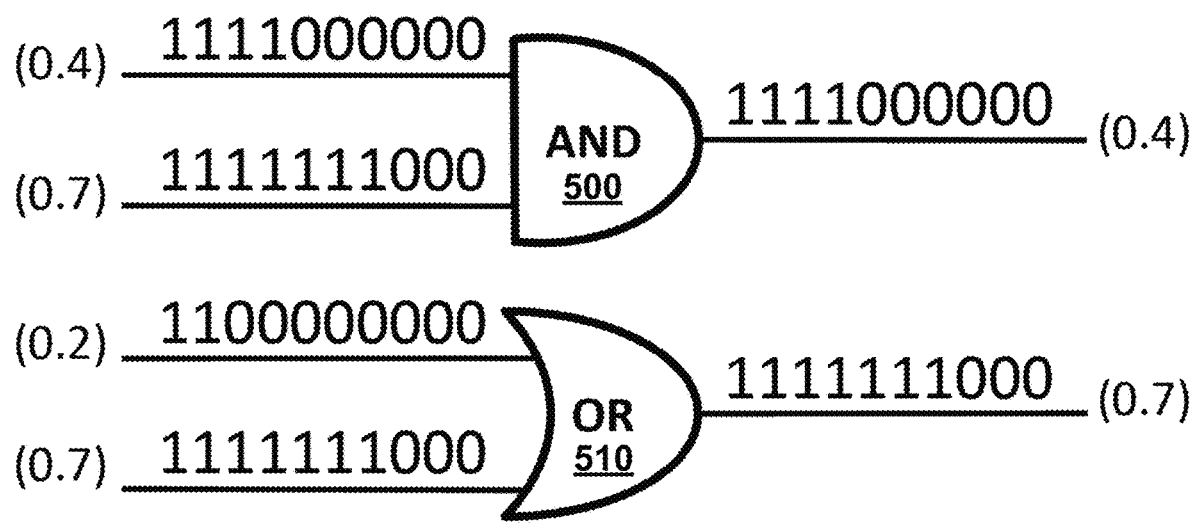
FIG. 5 is a diagram of example logic gates performing maximum and minimum operations on unary streams.

Each of CAS blocks 200A and 200B may include a first circuit configured to output the maximum of signals A and B and a second circuit configured to output the minimum of signals A and B. The maximum of signals A and B may be the signal that encodes a larger data value, and the minimum of signals A and B may be the signal that encodes a smaller data value. In some examples, a CAS block can sort two data bits by outputting the maximum data bit and the minimum data bit in a sorted order. As shown in the example of FIG. 5, the first circuit may include an OR gate, and the second circuit may include an AND gate. This relatively simple circuitry may result in a smaller and cheaper integrated circuit with lower power consumption, as compared to a binary sorting network.

Hardware sorting networks are different from software algorithms for sorting such as quick sort, merge sort, bubble sort, etc. since the order of comparisons is fixed in advance. Further, the order of a hardware sorting network is typically not data dependent as is the case with software algorithms. Two example configurations of sorting networks that may be implemented with the techniques described herein are a bitonic sorting network and an odd-even merge sorting network, which have relatively low latency for hardware-based sorting.

Figure 3:
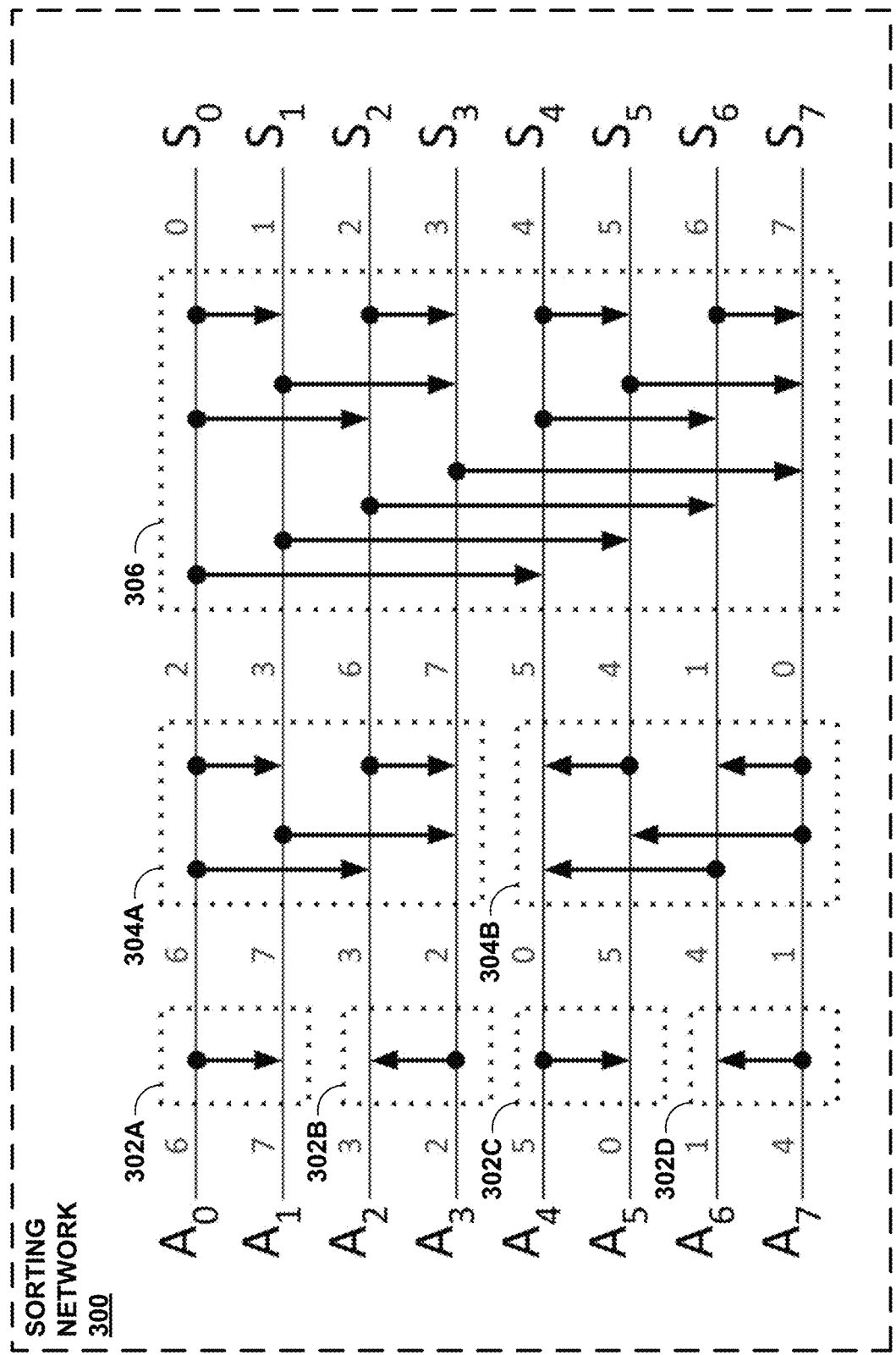
FIG. 3 is a conceptual block diagram showing an example CAS network for sorting eight data values.

FIG. 3 is a conceptual block diagram showing an example sorting network for sorting eight data values using the techniques described herein. Although FIG. 3 depicts the sorting network (e.g., a compare-and-swap network) as receiving eight input values, the sorting network can receive any number of input values such as 16, 32, 64, 128, and 256 data inputs. The inputs to sorting network 300 can be binary values, integers, or floating-point numbers ranging from four-bit precision to 256-bit precision or more.

Sorting network 300 is a combination of compare-and-swap blocks configured to sorts a set of input data, labeled as $A_0$ through $A_7$. Sorting network 300 includes compare-and-swap blocks 302A-302D, 304A, 304B, and 306. Compare-and-swap blocks 304A and 304B may each include four compare-and-swap subblocks, and compare-and-swap block 306 includes twelve compare-and-swap subblocks. Each subblock is indicated the symbols shown in FIGS. 2A and 2B.

Each compare-and-swap (CAS) block compares two input values and swaps the values at the output, if required. Sorting network 300 may be a bitonic sorting network, which is a popular configuration for a sorting network that has the lowest known latency for hardware-based sorting. Bitonic Sort uses a key procedure called Bitonic Merge (BM). Given two equal size sets of input data, sorted in opposing directions, the BM procedure will create a combined set of sorted data. It recursively merges an ascending and a descending set of size N/2 to make a sorted set of size N. The total number of CAS blocks in an N-input bitonic sorting is $N \times \log_2(N) \times (\log_2(N)+1)/4$. FIG. 3 shows sorting network 300 for an 8-input bitonic sorting network consisting of 24 subblocks. 16-input, 32-input, and 256-input bitonic sorting networks can be similarly constructed using 80, 240, and 4,608 CAS blocks, respectively.

An odd-even merge sorting network recursively merges two ascending sequences of length N/2 to make a sorted sequence of length N. Odd-even merge sorting units use fewer CAS blocks than bitonic sorting units, but often have more complex wiring.

Weighted binary radix is a format for representing numbers in the field of computer engineering. The weighted binary representation is compact; however, computing on this representation is relatively complex, since each bit must be weighted according to its position. Also, the representation is very susceptible to noise: a flipped bit can introduce a large error if the flipped bit is a significant bit in the representation.

In contrast, stochastic processing can rely on uniformly distributed random bit-streams. All digits in a stochastic bit stream may have the same weight. Numbers are limited to the [0, 1] interval and encoded by the probability of obtaining a one versus a zero in the stream. To represent a real number with a resolution of $2^{-M}$, a stream of $2^M$ bits is required. A stochastic representation is much less compact than weighted binary; this translates to high latency. A serial representation such as stochastic or unary is exponentially longer than a binary positional representation. However, complex functions can be computed with remarkably simple logic. For example, multiplication can be performed using a single AND gate. Also, the representation can tolerate high clock skew, timing errors, and soft logic errors (e.g., bit flips).

The processing for stochastic computing (SC) within the circuits described herein can, in some examples, be performed deterministically. If properly structured, computation on deterministic bit-streams can be performed with the same circuits as are used in SC. The results of such example implementations according to the techniques are completely accurate with no random variations; furthermore, the latency is greatly reduced.

Figure 4:
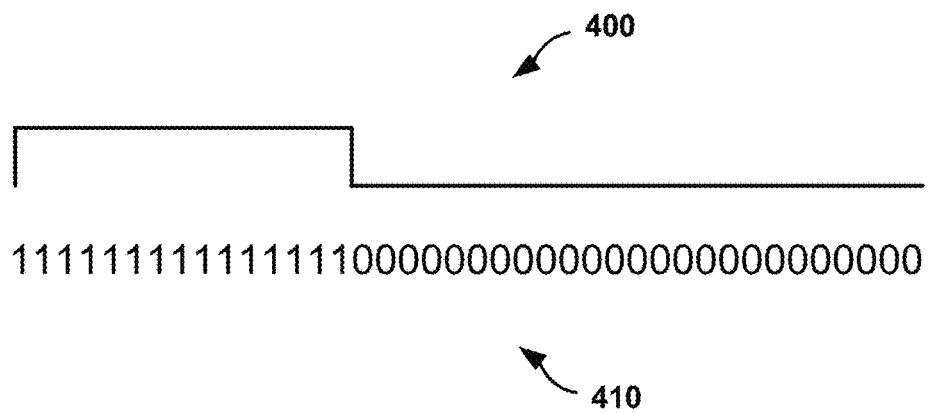
FIG. 4 is a diagram of an example time-based unary representation and an example digital-stream unary representation.

FIG. 4 is a diagram of an example time-based unary representation 400 and an example digital-stream unary representation 410. Time-based unary representation 400 is a PWM signal with a duty cycle that can encode a numerical value. Digital-stream unary representation 410 is a bit stream where the proportion of bits that are one or zero can encode a numerical value. In the example shown in FIG. 4, time-based unary representation 400 and digital-stream unary representation 410 can represent the same numerical value.

In unary processing, numbers are encoded uniformly by a sequence of one value (e.g., one) followed by a sequence of the other value (e.g., zero). This uniform sequence of bits is called a unary stream. As with stochastic streams, all the bits have equal weight. This property of unary representation provides immunity to noise. Multiple bit flips in a long unary stream produce small and uniform deviations from the nominal value.

In some examples, time-based unary representation 400 is a clocked signal with a high value for a first portion of a clock cycle and a low value for a second portion of a clock cycle. FIG. 4 may depict a single clock cycle for time-based unary representation 400. The first portion of time-based unary representation 400 is a pulse with a time duration that may be a fraction of the clock cycle. For example, if time-based unary representation 400 has a clock period of one nanosecond, the pulse may last for three or four hundred picoseconds. In other examples, the time period of time-based unary representation 400 may span multiple clock cycles. As shown in FIG. 4, digital-stream unary representation 410 has forty data bits, where each data bit can last one clock cycle. Thus, time-based unary representation 400 can represent a numerical value of 0.375 because representation 400 has a duty cycle of 37.5%. Digital-stream unary representation 410 can represent a numerical value of 0.375 because representation 410 has fifteen data bits with a high value out of forty total data bits.

FIG. 5 is a diagram of example logic gates 500 and 510 performing maximum and minimum operations on unary streams. The maximum (Max) and minimum (Min) value functions are two useful functions with simple and low cost unary implementation. AND gate 500 gives the Min of two unary streams when two equal-length unary streams are connected to its inputs. OR gate 510 gives the Max of two unary streams when two equal-length unary streams are connected to its inputs. These gates showed a similar functionality when fed with correlated stochastic bit-streams. FIG. 5 shows an example of finding the Max and Min values in unary processing. Absolute-value subtraction (using an XOR gate), comparison (using a D-type flip-flop), and multiplication (using an AND gate) of unary streams may be found in U.S. Patent Application Publication No. 2018/0204131, filed on Jan. 12, 2018, entitled "Stochastic Computation Using Pulse-Width Modulated Signals," which has been incorporated herein by reference in its entirety.

The representation of numbers in unary processing is not limited to purely digital bit-streams. A time-based interpretation of numbers is also possible using pulse modulation of data. FIG. 3 shows both approaches: time-based representation 300 and digital-based representation 310. While both approaches can operate on the same unary logic, time-based representation 300 offers a seamless solution to the increasing number of time-based sensors and can be exploited in addressing the long latency problem of unary circuits.

Figure 6A:
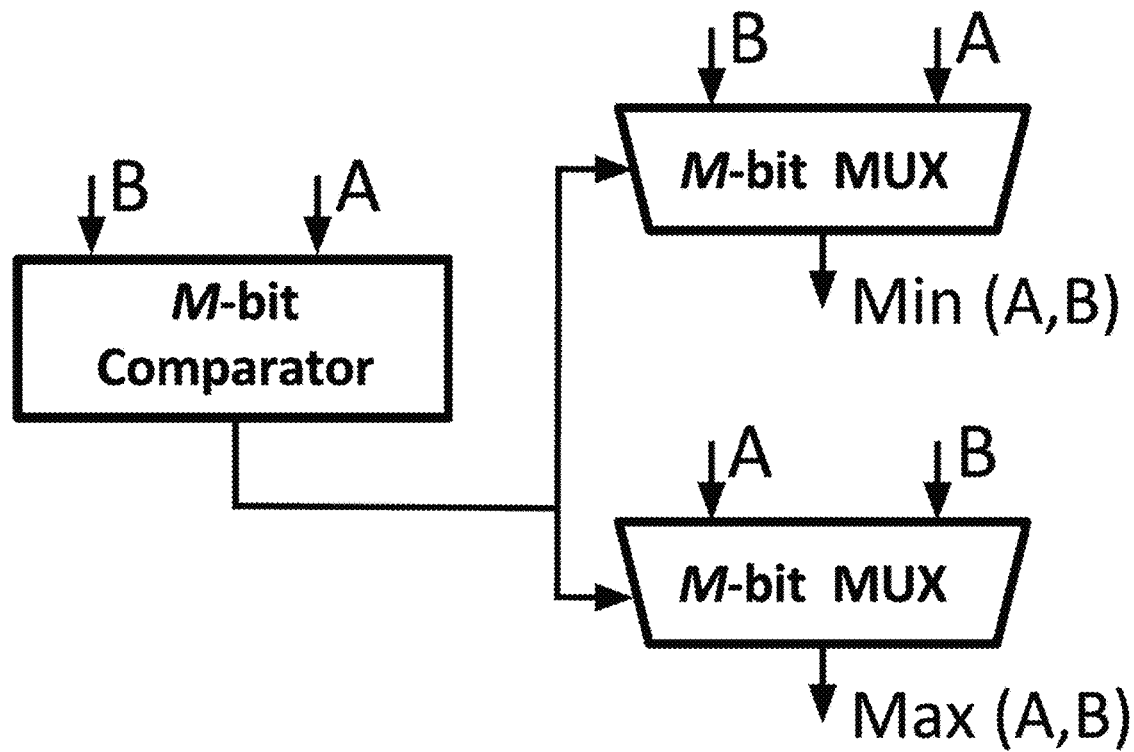
FIGS. 6A and 6B show hardware implementations of a CAS block in binary design and unary design.
Figure 6B:
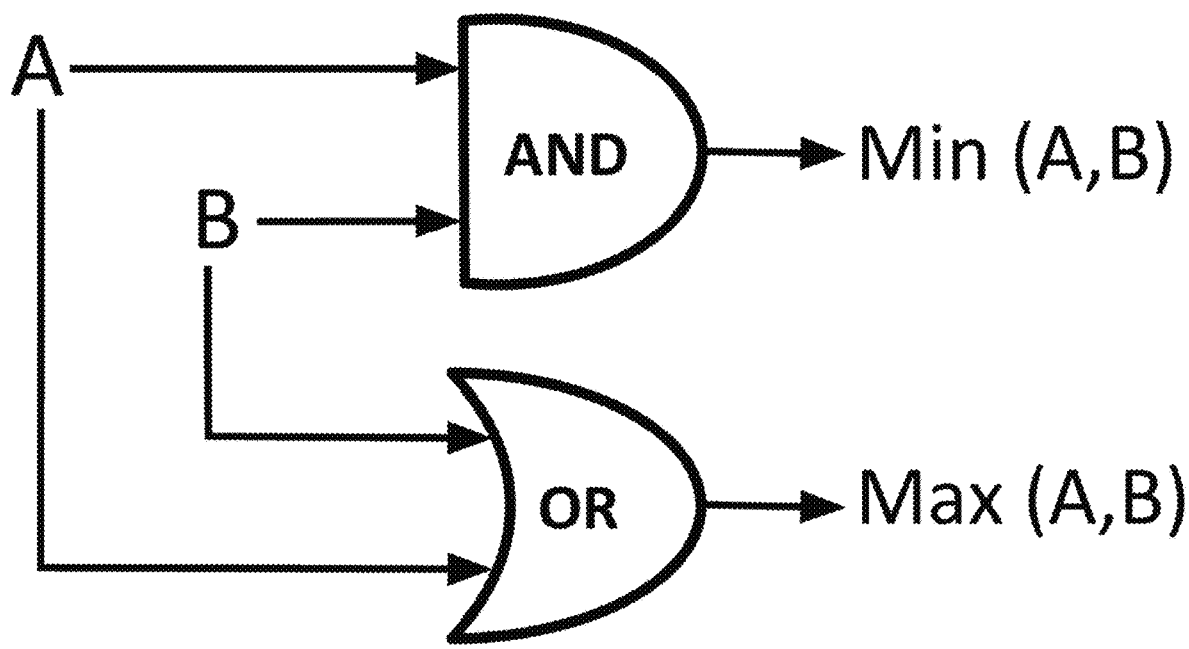

FIGS. 6A and 6B show hardware implementations of a compare-and-swap (CAS) block in binary design and unary design. Sorting networks are made of CAS blocks. The hardware cost of a sorting network may be a direct function of the number of CAS blocks and the cost of each block. As shown in FIG. 6A, in a weighted binary design with a data-width of M bits, each CAS block consists of one M-bit comparator and two M-bit multiplexers. In the unary domain shown in FIG. 6B, however, one AND and one OR gate is sufficient to synthesize a CAS block. The sorting networks can therefore be synthesized regardless of the resolution of the input data. While the synthesized circuit may be much less costly than the circuit synthesized in the binary approach, additional overhead may be incurred for conversion units which can be used to convert the data between the binary and the unary formats, and there may be a longer time to perform the operation on $2^M$-bit long streams.

The logic circuitry shown in FIG. 6B includes two logic gates for a CAS block. In contrast, a single CAS block for a binary sorting network could have hundreds or thousands of logic gates. Thus, sorting time-encoded signals, rather than sorting binary numbers, can result in substantially smaller chip area, cheaper circuitry, and lower power consumption.

Figure 7:
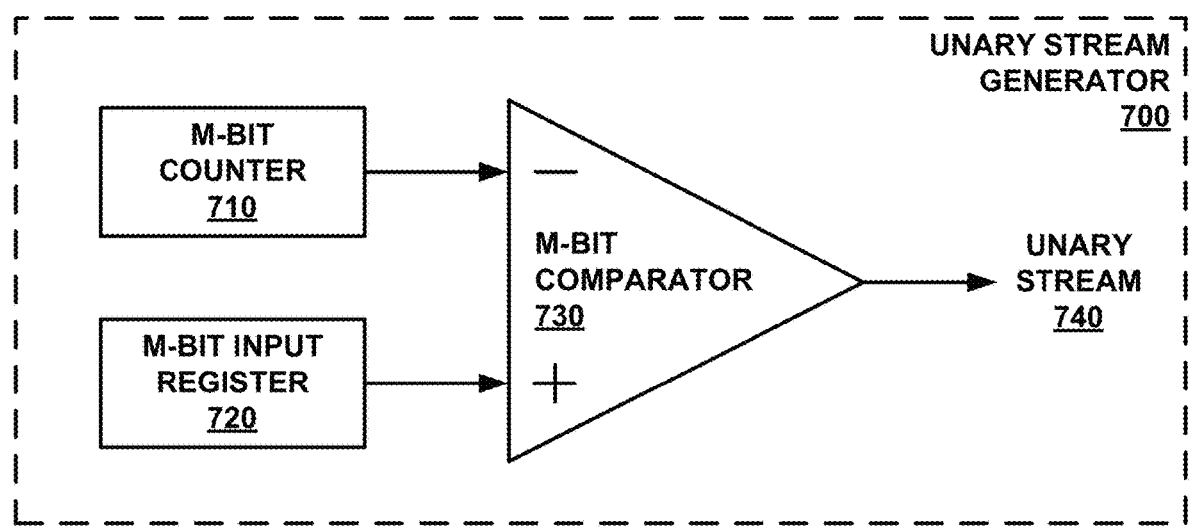
FIG. 7 is a conceptual block diagram of a unary stream generator.
Figure 8A:
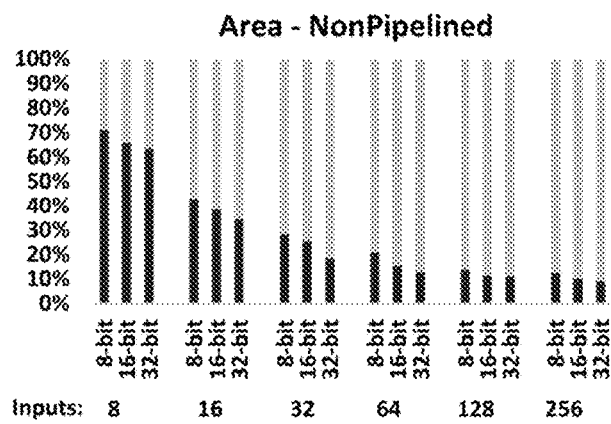
FIGS. 8A-8D are graphs showing the normalized area and power cost numbers for nonpipelined and pipelined structure.
Figure 8B:
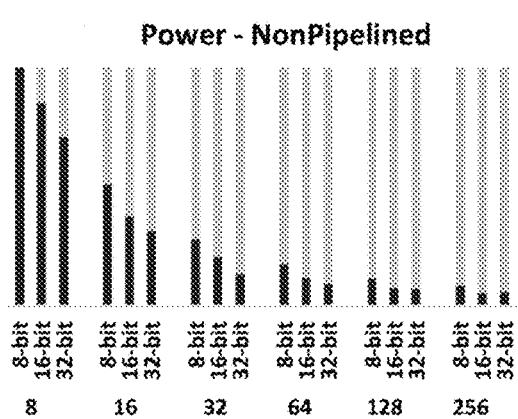
Figure 8C:
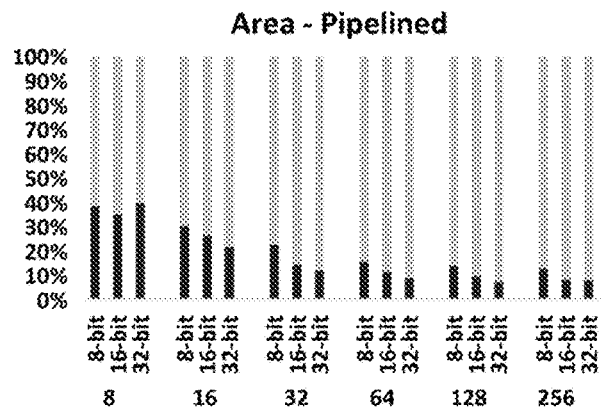
Figure 8D:
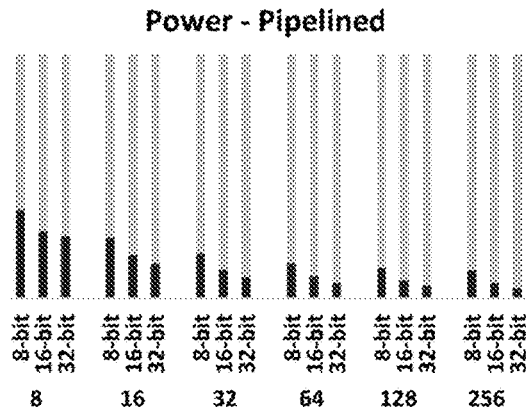

FIG. 7 is a conceptual block diagram of a unary stream generator 700. The range of counter 710 and register 720 can be the same: zero to $2^M-1$. Counter 710 may be configured to count through this range while the value outputted by register 720 remains constant. Comparator 730 outputs a value of one for unary stream 740 until the count outputted by counter 710 is greater than the value stored in register 720. When the count outputted by counter 710 is greater than the value stored in register 720, comparator outputs a value of zero for unary stream 740.

Assuming that the input data is given in binary format and the result must again be in binary, a unary stream generator can convert the data from binary to unary and a counter is required to count the number of ones in the final unary stream to convert the result back into binary. While the converters are data-width dependent, the CAS blocks synthesized with the unary approach are independent of data resolution.

Verilog hardware descriptions of complete bitonic sorting networks for 8, 16, 32, 64, 128, and 256 data inputs were developed for both binary and unary approaches. For the unary approach, the architectures include the required conversion units from/to binary. The designs were synthesized using the Synopsys Design Compiler vH2013.12 and a 45 nm standard-cell library. A data-width of 8 bits was used. A non-pipelined version of each architecture was developed to find the minimum hardware cost.

Table I shows the synthesis results for nonpipelined implementations. The unary approach could save hardware costs by up to 91%. For small networks like the 8-input sort networks, the cost overhead of converters was comparable to the saving due to using a low-cost CAS implementation and so lower savings are achieved. By increasing the number of inputs, and so the number of CAS blocks, the savings dominate the overheads and a hardware area saving of around 91% is achieved when implementing the 256-input sorting network with the unary approach.

TABLE I

| | | | | | | | | | |
|---|---|---|---|---|---|---|---|---|---|
| Synthesis results of complete bitonic sort networks (nonpipelined). | | | | | | | | | |
| # of inputs and outputs | # of CAS units | Data width | Area ($\mu m^2$) | | Critical Path (ns) | | Power (@max f) - (@50 MHz) (mW) | | |
| | | | Conven. | Unary | Conven. | Unary | Conven. | Unary | Conven. | Unary |
| 8 | 24 | 8-bit | 3,086 | 2,194 | 1.85 | 0.74 | 1.30 | 3.26 | 0.12 | 0.13 |
| | | 16-bit | 6,865 | 4,531 | 2.05 | 0.75 | 2.63 | 5.59 | 0.27 | 0.23 |
| | | 32-bit | 14,868 | 9,456 | 2.41 | 0.77 | 4.90 | 10.1 | 0.62 | 0.44 |
| 16 | 80 | 8-bit | 10,534 | 4,511 | 2.73 | 0.87 | 3.66 | 5.30 | 0.49 | 0.25 |
| | | 16-bit | 22,920 | 8,901 | 3.42 | 0.89 | 6.61 | 8.94 | 1.17 | 0.44 |
| | | 32-bit | 49,812 | 17,274 | 3.80 | 0.93 | 13.4 | 15.9 | 2.63 | 0.83 |

TABLE I-continued

Synthesis results of complete bitonic sort networks (nonpipelined).

| # of inputs and outputs | # of CAS units | Data width | Area (µm²) | | Critical Path (ns) | | Power (@max f) - (@50 MHz) (mW) | | | |
|---|---|---|---|---|---|---|---|---|---|---|
| | | | Conven. | Unary | Conven. | Unary | Conven. | Unary | Conven. | Unary |
| 32 | 240 | 8-bit | 32,508 | 9,235 | 4.06 | 1.07 | 8.86 | 8.40 | 1.75 | 0.49 |
| | | 16-bit | 68,621 | 17,643 | 5.05 | 1.13 | 16.6 | 13.8 | 4.18 | 0.86 |
| | | 32-bit | 149,669 | 27,811 | 5.90 | 1.12 | 31.8 | 25.4 | 11.3 | 1.52 |
| 64 | 672 | 8-bit | 90,691 | 19,028 | 5.71 | 1.33 | 19.8 | 13.4 | 5.48 | 0.96 |
| | | 16-bit | 191,174 | 29,259 | 7.03 | 1.35 | 39.2 | 22.5 | 13.6 | 1.60 |
| | | 32-bit | 431,182 | 56,598 | 8.00 | 1.37 | 78.5 | 41.2 | 33.1 | 3.03 |
| 128 | 1,792 | 8-bit | 242,049 | 33,916 | 7.49 | 1.62 | 44.4 | 21.4 | 15.7 | 1.80 |
| | | 16-bit | 523,565 | 60,686 | 9.27 | 1.63 | 89.8 | 37.1 | 41.1 | 3.19 |
| | | 32-bit | 1,047,646 | 115,835 | 10.14 | 1.63 | 165.7 | 69.1 | 85.4 | 6.05 |
| 256 | 4,608 | 8-bit | 586,456 | 74,719 | 9.71 | 1.91 | 88.7 | 36.5 | 42.2 | 3.64 |
| | | 16-bit | 1,239,154 | 126,804 | 11.79 | 1.94 | 181.3 | 62.1 | 102 | 6.40 |
| | | 32-bit | 2,560,803 | 234,957 | 12.89 | 1.97 | 367.7 | 113 | 221 | 12.0 |

Table I presents the total (e.g., dynamic plus static) power consumption at the maximum feasible working frequency of each architecture, and also at 50 Mhz frequency. The static power or leakage is the dominant power when the system operates at low frequencies. The static power or leakage is directly proportional to the hardware cost and so a sort network with a lower hardware cost will have a lower leakage power. When a system works at its maximum frequency, dynamic power, which is an increasing function of the working frequency, is the dominant one.

Although the unary designs would have a much lower power consumption at low speeds, due to a lower critical path latency and so higher maximum working frequency, the power numbers reported for the unary implementations of the 8 and 16 input sorting networks are greater than the power numbers reported for their corresponding binary implementations. For larger sorting networks (32-input and above), the simplicity of the unary design has led to even a lower power consumption at the maximum working frequency than that of the binary implementation.

Due to a simpler architecture, the critical path (CP) latency of the designs synthesized with the unary approach is lower than that of the binary designs. However, the total latency of the unary approach, which is the product of the CP latency and $2^M$ (the number of clock cycles that the system processes the unary stream), is much more than the latency of the binary design (one clock cycle×CP latency). Although the longer latency of the unary approach is still acceptable for many applications, another issue is the energy consumption. Energy consumption is evaluated by the product of the processing time and the total power consumption. Although the unary implementations of the sorting networks have often shown lower power consumption for a fixed frequency, a very long processing time of unary design would lead to a higher energy consumption than their binary counterparts.

TABLE II

Synthesis results of complete bitonic sort network (pipelined).

| # of inputs and outputs | CAS units | Pipeline Stages | Data width | Area (µm²) | | Critical Path (ns) | | Power (@max freq) (@50 MHz) (mW) | | | |
|---|---|---|---|---|---|---|---|---|---|---|---|
| | | | | Conven. | Unary | Conven. | Unary | Conven. | Unary | Conven. | Unary |
| 8 | 24 | 6 | 8-bit | 6,926 | 2,659 | 0.42 | 0.39 | 19.5 | 8.1 | 0.46 | 0.16 |
| | | | 16-bit | 14,383 | 5,024 | 0.49 | 0.42 | 35.6 | 11.6 | 0.97 | 0.27 |
| | | | 32-bit | 25,066 | 9,916 | 0.53 | 0.49 | 66.5 | 17.2 | 1.88 | 0.48 |
| 16 | 80 | 10 | 8-bit | 19,338 | 5,834 | 0.42 | 0.40 | 67.9 | 17.0 | 1.50 | 0.37 |
| | | | 16-bit | 39,554 | 10,323 | 0.48 | 0.44 | 126 | 23.3 | 3.17 | 0.56 |
| | | | 32-bit | 83,102 | 18,065 | 0.52 | 0.50 | 241 | 33.9 | 6.64 | 0.94 |
| 32 | 240 | 15 | 8-bit | 57,900 | 13,095 | 0.42 | 0.41 | 213 | 38.5 | 4.68 | 0.86 |
| | | | 16-bit | 118,202 | 17,029 | 0.50 | 0.46 | 381 | 48.2 | 9.95 | 1.16 |
| | | | 32-bit | 248,129 | 29,682 | 0.53 | 0.50 | 748 | 70.0 | 21.0 | 1.88 |
| 64 | 672 | 21 | 8-bit | 161,934 | 25,248 | 0.42 | 0.44 | 602 | 83.0 | 13.3 | 1.92 |
| | | | 16-bit | 329,787 | 37,726 | 0.50 | 0.47 | 1105 | 104 | 28.7 | 2.61 |
| | | | 32-bit | 718,216 | 63,144 | 0.52 | 0.50 | 2201 | 149 | 61.9 | 4.02 |
| 128 | 1,792 | 28 | 8-bit | 431,062 | 59,579 | 0.42 | 0.47 | 1625 | 182 | 36.0 | 4.53 |
| | | | 16-bit | 901,206 | 84,646 | 0.49 | 0.50 | 3070 | 221 | 78.8 | 5.90 |
| | | | 32-bit | 1,834,850 | 134,746 | 0.52 | 0.52 | 5990 | 310 | 167 | 8.70 |
| 256 | 4,608 | 36 | 8-bit | 1,107,998 | 140,006 | 0.42 | 0.49 | 4228 | 407 | 93.0 | 10.6 |
| | | | 16-bit | 2,294,989 | 189,903 | 0.49 | 0.51 | 7859 | 489 | 204 | 13.3 |
| | | | 32-bit | 4,714,805 | 289,723 | 0.54 | 0.54 | 15024 | 648 | 437 | 18.9 |

Table II gives the synthesis results for a fully pipelined structure (only one CAS block between pipeline registers) of the developed designs. Due to using a large number of pipeline registers, the fully pipelined structure can be significantly more costly than the nonpipelined structure, but a higher working frequency may be achieved with the pipelined one. Designing the sorting network with only one CAS block between pipeline registers leads to a higher latency and total area than the case with larger number of CAS blocks between pipeline registers. However, the one CAS block approach (fully pipelined) results in a higher sorting throughput. Thus, choosing the number of CAS blocks between pipeline registers is a tradeoff between the total area, latency, and throughput.

Table II shows the hardware area cost of the pipelined unary designs are 61%-92% lower than the hardware cost of the pipelined binary designs. Observing a high saving in the area of the small-scale sorting circuits, such as the 8-input sorting network (61% for 8-bit data), is due to using simpler pipeline registers (1-bit instead of M-bit) in the pipelined unary design compared to the pipelined binary design.

FIGS. 8A-8D are graphs showing the normalized area and power cost numbers for nonpipelined and pipelined structure. FIGS. 8A-8D show the power cost numbers at 50 MHz frequency. In each configuration, the simulation results are normalized to the value of the design with that configuration.

Figure 9:
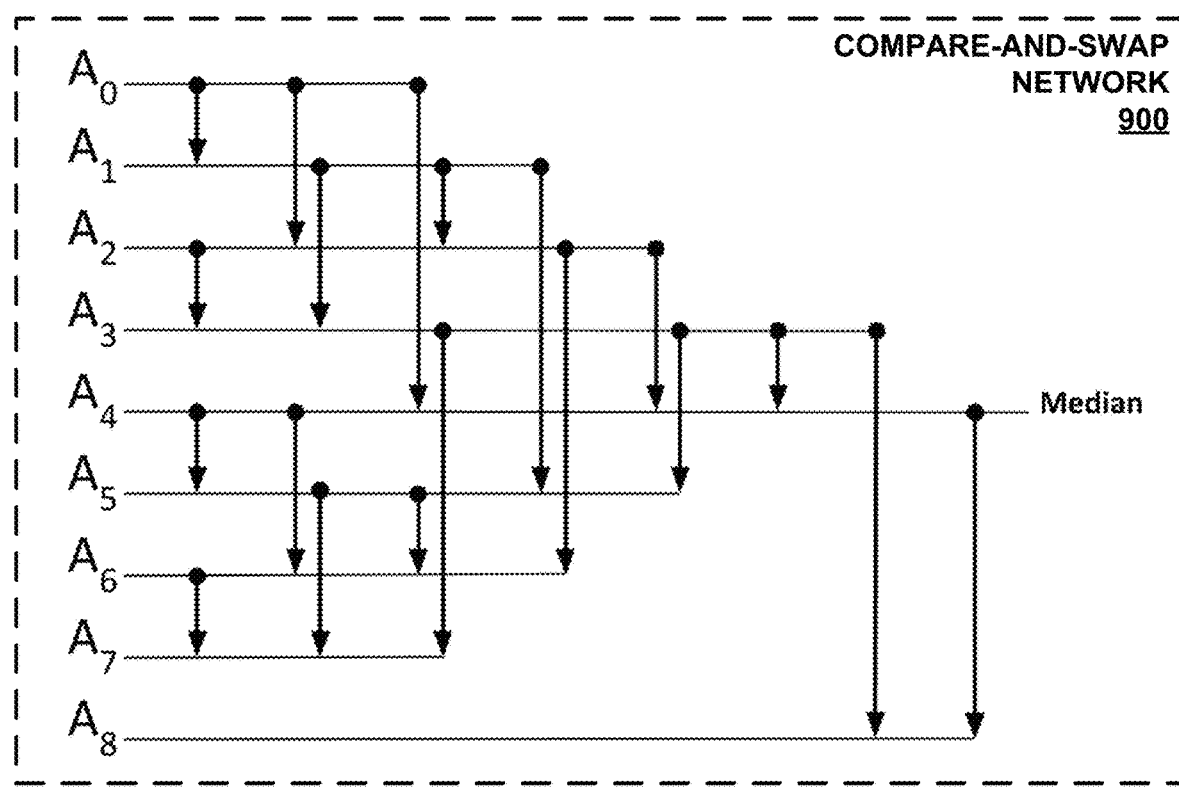
FIG. 9 is a diagram showing a CAS network for a 3×3 median filter.
Figure 10:
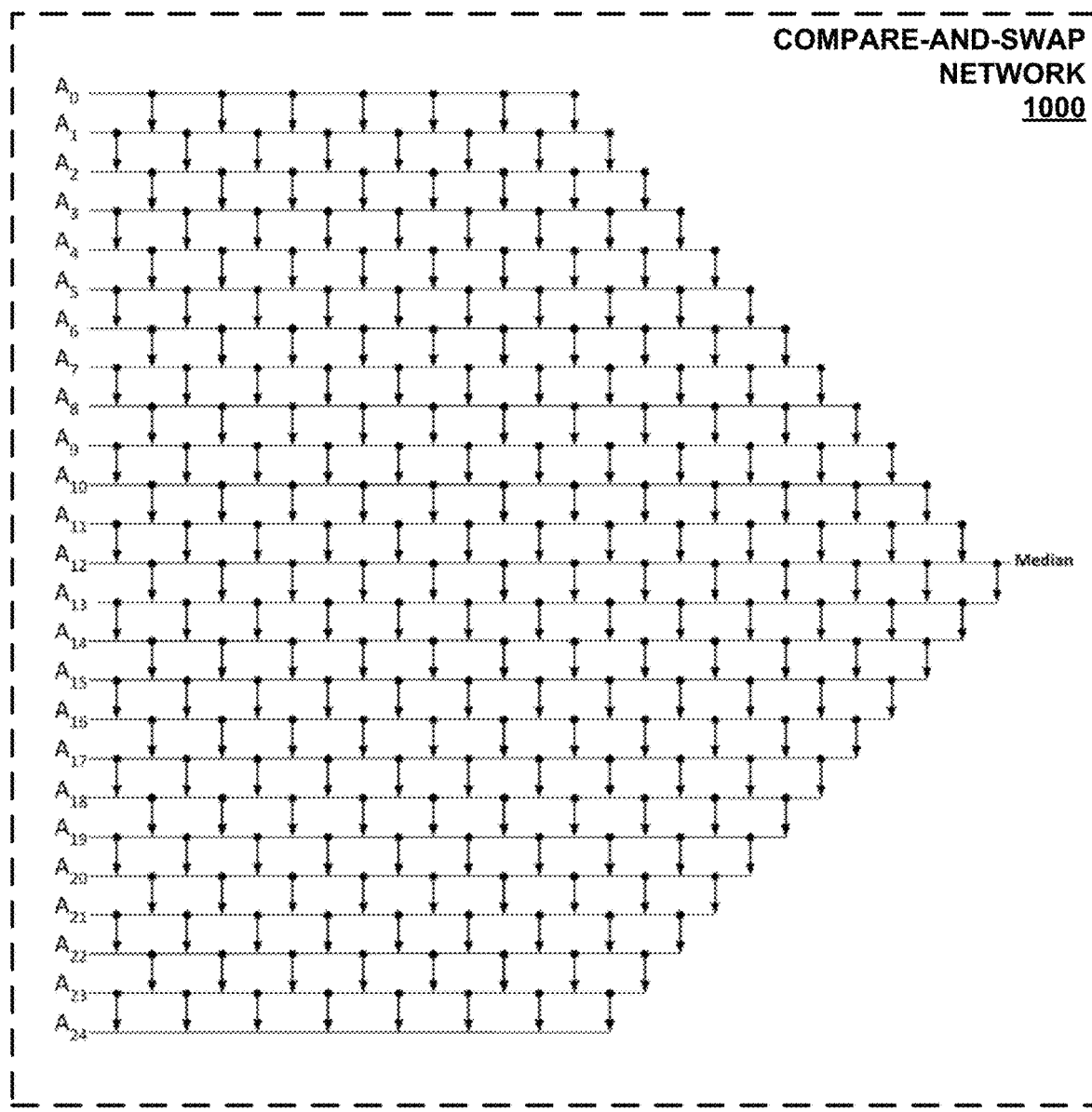
FIG. 10 is a diagram showing a CAS network for a 5×5 median filter.

A median filter is a non-linear filter that can be used in image and signal processing applications. The median filter replaces each input data with the median of all the data in a local neighborhood. This process results in filtering out impulse noise and smoothing of the image while preserving properties such as the edge information. In real-time image and video applications, the digital image data are affected by noise that can result from image sensors or transmission of median filter. The incoming data is sorted as the data passes the network. The middle element of the sorted data is the median. As the sorting network can be easily pipelined, the approach may provide the best performance. The local neighborhood in median filtering is often a 3×3 or 5×5 window with the target input data at the center. FIGS. 9 and 10 show sorting networks 900 and 1000 for a 3×3 and a 5×5 median filters, respectively.

CAS networks 900 and 1000 implement a 3×3 and a 5×5 median filter, respectively. The CAS blocks of FIGS. 6A and 6B can be used in the architecture of CAS network 900.

Table III shows the synthesis results for these architectures implemented according to the techniques described herein. The overhead in the bit-stream based unary design includes the converters from/to binary. Similar to the synthesis results reported for the complete sort networks, the unary implementation of the median filters significantly reduces the hardware cost, up to 90% for the 5×5 median filter architecture. The pipelined implementations have a higher working frequency and a higher throughput. Comparing the power consumption of the pipelined implementations show that, for the same working frequency, the unary designs have a significantly lower power consumption.

Table III shows that the unary implementation significantly reduces the hardware cost. For applications in which hardware cost and power consumption are the main priorities, the unary design outperforms the binary design. However, for high-performance, low-energy applications the binary design can be a better choice. Using time-based representation of data, the latency and energy consumption of the unary-based median filtering can be improved at the cost of a slight accuracy loss.

TABLE III

Synthesis results of the sorting network-based median filters for data-width = 8.

| Median Filter | Design Approach | Area ($\mu m^2$) | | | Latency (ns) | | Power (mW) | Energy (pJ) |
|---|---|---|---|---|---|---|---|---|
| | | CAS Logic | Overhead | Total | CP | Total | (@max freq) | |
| 3 × 3 | Binary-NonPipelined | 2,167 | — | 2,167 | 2.10 | 2.10 | 1.03 | 2.1 |
| | Binary-Pipelined (8-stage) | 2,167 | 3,384 | 5,551 | 0.43 | 3.44 | 15.56 | 6.6 |
| | Unary-NonPipelined | 79 | 917 | 996 | 0.70 | 179.2 | 0.95 | 170.2 |
| | Unary-Pipelined (8-stage) | 79 | 1,292 | 1,371 | 0.40 | 102.4 | 3.08 | 315.3 |
| | Unary-Time-based | 79 | 776 | 855 | 0.39 | 0.39 | 1.78 | 0.69 |
| 5 × 5 | Binary-NonPipelined | 32,772 | — | 32,772 | 6.77 | 6.77 | 5.76 | 38.9 |
| | Binary-Pipelined (26-stage) | 32,772 | 28,208 | 60,980 | 0.43 | 11.18 | 219 | 94.1 |
| | Unary-NonPipelined | 1,051 | 1,988 | 3,039 | 1.07 | 273.9 | 0.93 | 254.7 |
| | Unary-Pipelined (26-stage) | 1,051 | 6,377 | 7,428 | 0.40 | 102.4 | 19.68 | 2015.2 |
| | Unary-Time-based | 1,051 | 1,960 | 3,011 | 0.78 | 0.78 | 2.71 | 2.11 | images. A hardware implementation of the median filter is used for de-noising. The high computational complexity of median filters makes the hardware implementation expensive and inefficient for many applications. This disclosure describes low-cost implementations of median filters similar to the unary sorting networks discussed above.

FIG. 9 is a diagram showing a CAS network 900 for a 3×3 median filter, and FIG. 10 is a diagram showing a CAS network 1000 for a 5×5 median filter. Sorting network-based architectures consisting of a network of CAS blocks can be used as an approach for a hardware implementation of a A sorting network can be used in an image sensor that converts light intensity to an analog voltage or current. The data sensed by the image sensor can be processed by first converting the analog data to digital binary form using a conventional analog-to-digital converter and then processed using digital logic. In unary processing, this binary data is first converted to a unary bit stream and then processed using unary circuits. Processing of image pixels with 8-bit resolution can involve running the unary circuit for 256 cycles. Even with a higher working frequency, due to a large number of clock cycles running the circuit, the total latency of the processing using unary circuit may be more than that of processing with the binary design.

Near-sensor image processing (NSIP) can integrate some of the processing circuits (i.e., median filter circuit) with the sensing circuit, rather than performing this processing in the cloud or at another remote computer. NSIP architecture can potentially improve the power consumption, size, and costs of vision chips by performing the processing functions close to the sensor.

Figure 11:
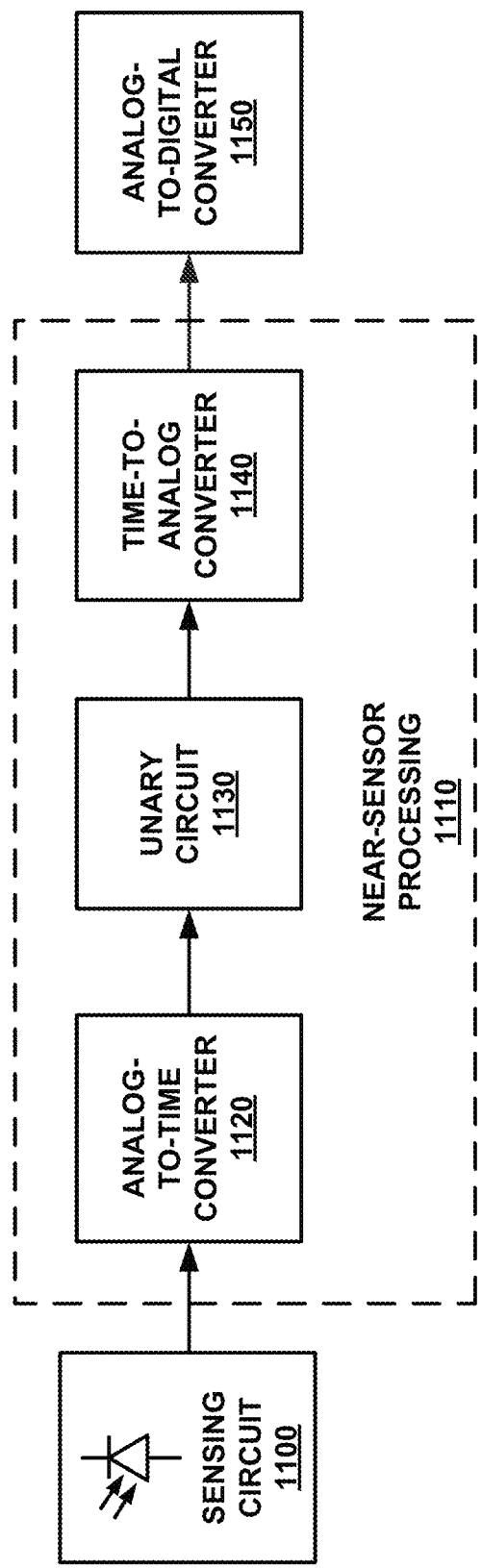
FIG. 11 is a conceptual block diagram of one example showing near-sensor processing performed by unary circuits.

FIG. 11 is a conceptual block diagram of one example showing near-sensor processing 1110 performed by unary circuits. Sensing circuit 1100 may be a camera, an environmental sensor (e.g., temperature, humidity, etc.), a physiological sensor, and/or any other type of sensor. Assuming that the output of sensing circuit 1100 is in voltage or current form, analog-to-time converter (ATC) 1120 (e.g., a PWM signal generator) can convert the sensed data to a time-encoded pulse signal. Additional example details of processing analog signals generated by a sensing circuit can be found in commonly assigned U.S. Provisional Patent Application Ser. No. 62/735,584, entitled "Stochastic Computing with Analog Memory", filed Sep. 24, 2018, the entirety of which is incorporated herein by reference.

Unary circuit 1130 can process the converted signal, and time-to-analog converter (TAC) 1140 can convert the output back to a desired analog format (e.g., using a voltage integrator). Sorting networks 100 and 300 and compare-and-swap networks 900 and 1000 are examples of unary circuit 1130. Analog-to-digital converter 1150 may receive the analog output from time-to-analog converter 1140 and convert the analog output to a digital number for storage or output.

Unary circuit 1130 may include an artificial neural network with multiple layers of circuitry. Each layer of unary circuit 1130 may be configured to perform a weighted sum (e.g., using matrix multiplication) of the data received from the previous layer. Although not shown in FIG. 11, near-sensor processing may also include a thresholding circuit configured to determine whether the output of unary circuit 1130 is greater (or less) than a threshold value. The thresholding circuit may be configured to compare one or more of the time-encoded signals outputted by unary circuit 1130 to the threshold value. The output of the thresholding circuit may be a classification of the data or a statistical description of the output of sensing circuit 1100. An example classification is obstacle detection for autonomous vehicles and unmanned aerial vehicles to determine whether an object is a person.

Figure 12:
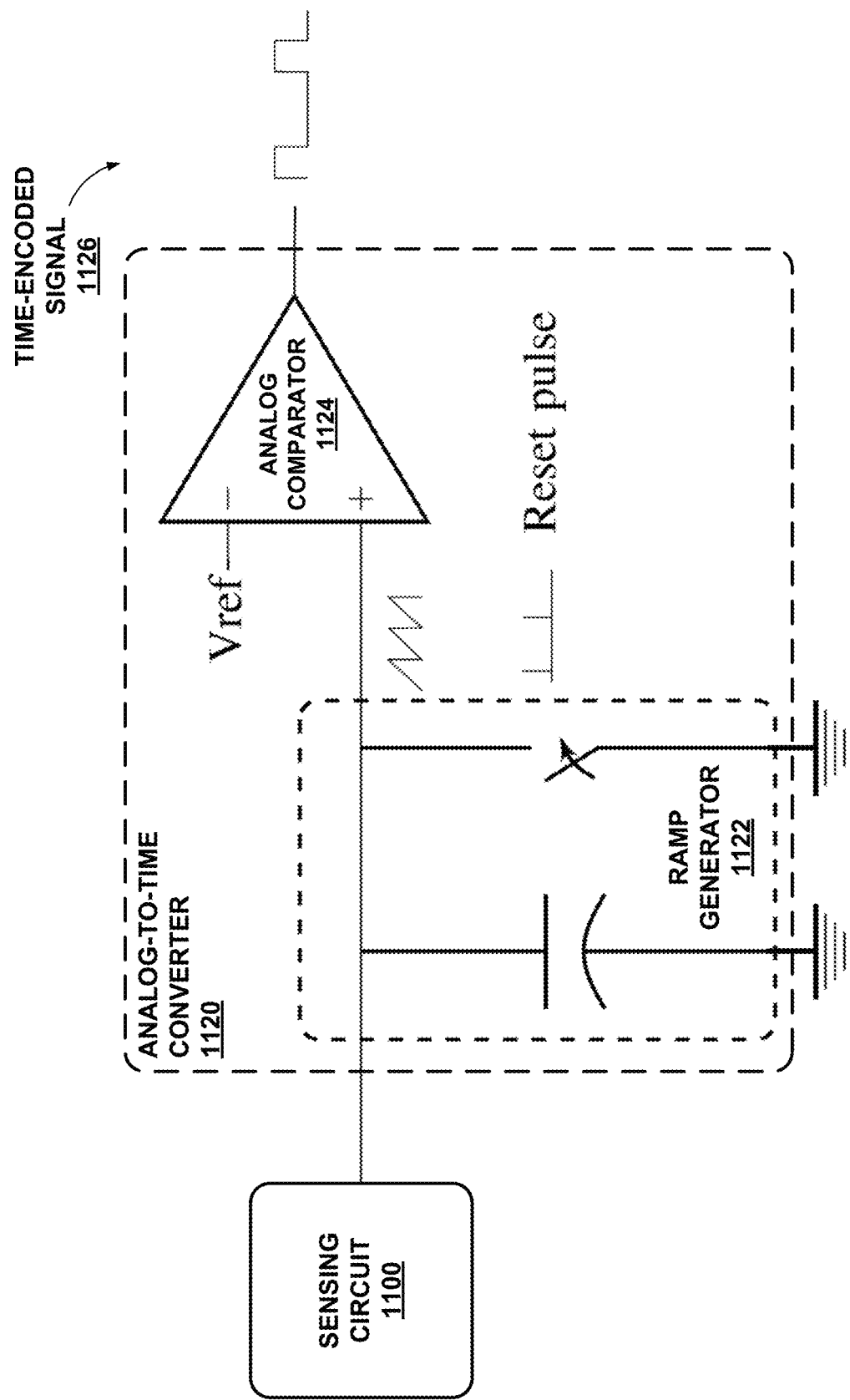
FIG. 12 is circuit diagram showing an analog-to-time converter.

FIG. 12 is circuit diagram showing an analog-to-time converter 1120. The circuitry of analog-to-time converter 1120 shown in FIG. 12 is an example configuration for analog-to-time converter 1120 shown in FIG. 11. Analog-to-time converter 1120 includes ramp generator 1122 and analog comparator 1124. Ramp generator 1122 is configured to generate a sawtooth waveform signal or triangle waveform signal (e.g., an asymmetric triangle waveform) based on a reset pulse. The reset pulse defines the frequency of the output signal and is generated using a clock signal. Analog-to-time converter 1120 is configured to receive an analog signal from sensing circuit 1100.

Analog comparator 1124 can output and deliver time-encoded signal 1126 to a sorting network (e.g., unary circuit 1130), where time-encoded signal 1126 may have a duty cycle that encodes the same numerical value as encoded by the analog signal generated by sensing circuit 1100. When the sawtooth or triangle waveform generated by ramp generator 1122 is greater than or equal the reference voltage, analog comparator 1124 may be configured to output a high value for time-encoded signal 1126. When the sawtooth or triangle waveform generated by ramp generator 1122 is less than the reference voltage, analog comparator 1124 may be configured to output a low value for time-encoded signal 1126.

Table III shows the area, latency, power, and energy consumption of the implemented median filtering circuits synthesized with the conventional binary, digital bitstream based unary, and the proposed time-based unary approach. A low-cost pulse-width modulator, shown in FIG. 12, was used as the ATC and a Gm-C active integrator was used as a TAC in the time-based unary design. While a pulse-width modulator can generate a periodic signal with a specific duty cycle and frequency, only one period of the generated signal is used for processing the data. The duty cycle can be determined by the direct-current (DC) level of the sensed data. The hardware cost and the energy consumption of ATC 1120 and TAC 1140 are a function of the target working frequency.

The area and energy numbers are reported including the overhead of the time-based unary design. A separate ATC is used for time-encoding each input data. A 3×3 median filter circuit may use nine ATCs. The reported overhead numbers are for a working frequency equal to the inverse of the CP latency of the circuit. Assuming that the clock signal that drives the ATC is available in the system, a lower working frequency may translate to a lower area and energy overhead. Table III shows that the total area of the time-based unary design including the overhead of ATCs and TACs is lower than the area cost of the digital bit stream-based nonpipelined version of the unary design. The total latency and the energy consumption of the time-based unary designs are better than those of the pipelined and nonpipelined structures of the unary design and also lower than those of the binary designs. A lower CP latency in the time-based unary designs in comparison to the nonpipelined unary design is due to not using unary stream generator and counter in the time-based approach.

One potential down-side of the time-based unary design, however, is a slight accuracy loss. The working frequency of the ATC affects the effective number of bits (ENOBs) in representing data and processing data, hence the accuracy of computation. To evaluate the performance of the median filtering unary designs when working with time-encoded input signals, SPICE netlists of both 3×3 and 5×5 median filtering circuits were developed and the operation of circuits was simulated on a 128×128 noisy soldier image.

Figure 13A:
FIGS. 13A-13C show the simulation results of image processing using median filtering techniques.
Figure 13B:
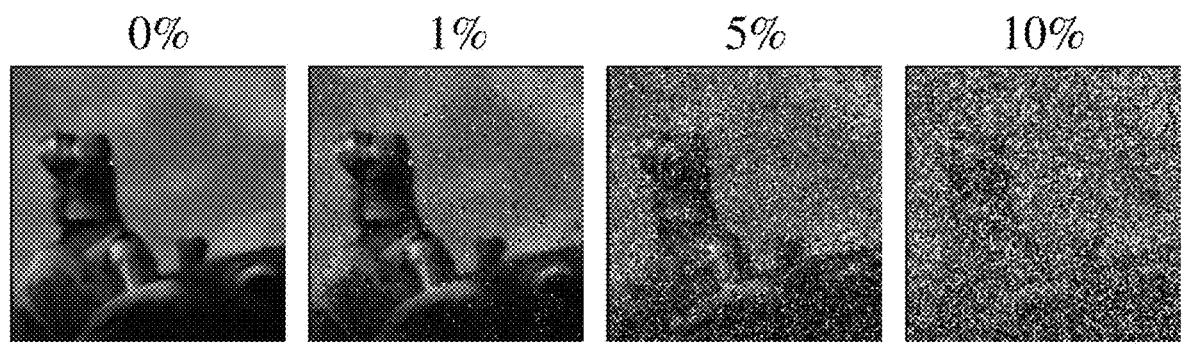
Figure 13C:
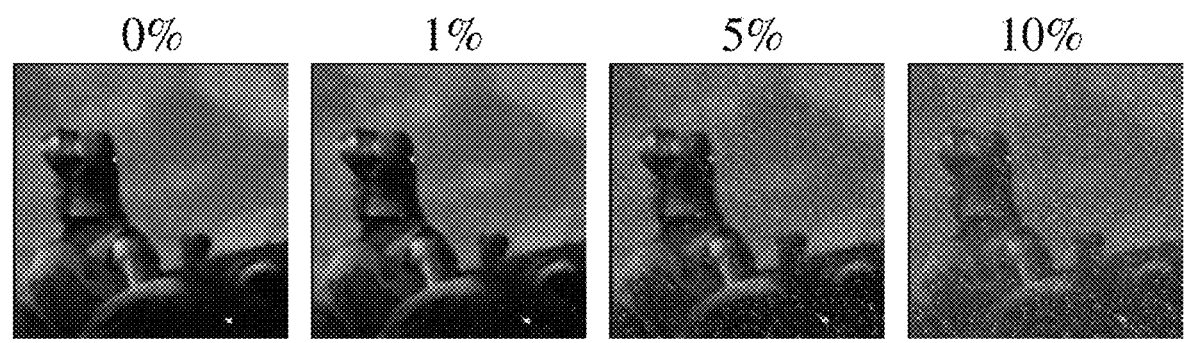

FIGS. 13A-13C show the simulation results of image processing using median filtering techniques. FIG. 13A shows the sample input image, and FIGS. 13B and 13C show the output images. Simulations were carried out using a 45-nm standard cell library in HSPICE. Table IV gives the average output error rates for the images produced using the time-based unary designs. Image pixel intensities were converted to pulse signals using the ATC shown in FIG. 12 and also using the HSPICE built-in pulse generator (an ideal ATC). Table IV shows these two methods corresponding to the rows "ATC of [30]" and "Ideal ATC," respectively. Comparing the output images with the expected output image (produced using a software-based implementation of the algorithm in MATLAB), the mean of the output error rates was calculated using Equation (1).

$$\text{Average error rate} = \frac{\sum_{i=1}^{W}\sum_{j=1}^{H}|P_{i,j} - E_{i,j}|}{255 \cdot (W \times H)} \times 100 \quad (1)$$

In Equation (1), $E_{i,j}$ is the expected value for location (i,j) in the output image, $P_{i,j}$ is the pixel value for the same location produced using the circuit, and W and H are the dimensions of the image. Table IV shows that increasing the length of the input signal (a lower working frequency) leads to a higher accuracy in the time-based approach. An average error rate of less than 1% is achieved in the 3×3 median filtering circuit with one nanosecond and in the 5×5 circuit with 5-ns processing time. The inherent inaccuracy in converting the values with the ATC shown in FIG. 12 can result in slightly higher error rates when comparing to the error rates where using an ideal ATC.

TABLE IV

Average error rate of processing sample image using time-based unary circuits.

| Median Filter Time-based Unary | | CP | 1 ns | 2 ns | 5 ns |
|---|---|---|---|---|---|
| | | Length of input signals (1/freq.) | | | |
| 3 × 3 | Ideal ATC | 2.09% | 0.84% | 0.45% | 0.19% |
| | ATC of [30] | 2.65% | 1.05% | 0.56% | 0.21% |
| 5 × 5 | Ideal ATC | 4.70% | 3.33% | 1.83% | 0.94% |
| | ATC of [30] | 4.86% | 3.66% | 1.90% | 1.01% |

Error in generating pulse signals (analog value to time conversion), error in measuring the output signal (time to analog conversion), and error due to skew noise are the main sources of errors in the time-based unary processing. A different gate delay for AND and OR gates, particularly, can be a main source of skew in the unary sorting networks. Such a skew is negligible for small sorting networks (e.g., 3×3 median filtering). However, for large sorting networks (e.g., 5×5 median filtering), the skew in each stage is propagated to the next stage, resulting a considerable skew error. With careful gate sizing and adjusting gate delays, or simply increasing the length of the input signals, this source of inaccuracy in the time-based unary design can be mitigated.

To evaluate the noise tolerance of the proposed unary designs in comparison to that of the corresponding conventional binary implementations, soft errors, i.e., bit flips, were randomly injected for 0%, 1%, 5%, and 10% noise injection rates on the inputs of CAS blocks of the 3×3 median filtering circuits, and the corresponding average output error rates were measured. A noise injection rate of 10% means that 10% of the total bits in the inputs of CAS blocks are randomly chosen and flipped. The sample image shown in FIG. 13A was used as the input to the circuits. For the conventional binary implementation, the data-width was fixed at 8 bits and bit streams of length 256 were used to represent values in the unary designs.

FIGS. 13A-13C show simulated performance of the implemented circuits at various noise injection rates. The unary implementation can achieve a higher noise tolerance compared to the binary implementation. For injection rates higher than 1%, the quality of the output image produced by the binary design degrades drastically leading to a useless image for injection rates higher than 5%. The noise immunity observed in the unary design is mainly due to the data encoding approach, a common property between the unary and the stochastic processing. Bits are equally weighted in unary streams and so bit flips produce small and uniform deviation from the nominal value.

A conventional weighted binary-based implementation of a large Batcher sorting network is costly considering the large number of CAS units that such a network entails. The very large-scale integration (VLSI) cost increases significantly with increasing resolution of the input data. The high hardware cost and the high power consumption of such networks restrict the application of binary sorting networks.

This disclosure describes an area and power efficient implementation of sorting networks based on unary processing. The core processing logic can include simple gates. The only overhead in the approach, the cost of converting data from/to binary, may be relatively small. The described circuit can have more than 90% area and power savings when compared to a conventional binary implementation. The penalty for this savings is latency. Processing digital unary streams requires a relatively long running time (e.g., more than 100 ns). Although unary circuits may have a 100× increase in latency over conventional weighted binary, this increase may be tolerable for many applications. For example, ten gray-scale high-definition (HD) (1280×720) images or four gray-scale full HD (1920×1080) images can be processed per second with the proposed scheme for a task such as median filtering, when operating on 256-bit long unary streams. In spite of the latency, a 90% decrease in power consumption might often make this approach a winning proposition.

A time-based unary design approach in which the input data is encoded in time and represented with pulse signals can mitigate the latency. The time-based approach can achieve a significant improvement in the latency and energy consumption, at the cost of a slight loss in accuracy. For example, more than 1000 gray-scale HD images or 400 grayscale full HD images can be processed per second with the proposed time-based unary implementation of the 3×3 median filtering at the cost of only 1% loss in accuracy.

Figure 14:
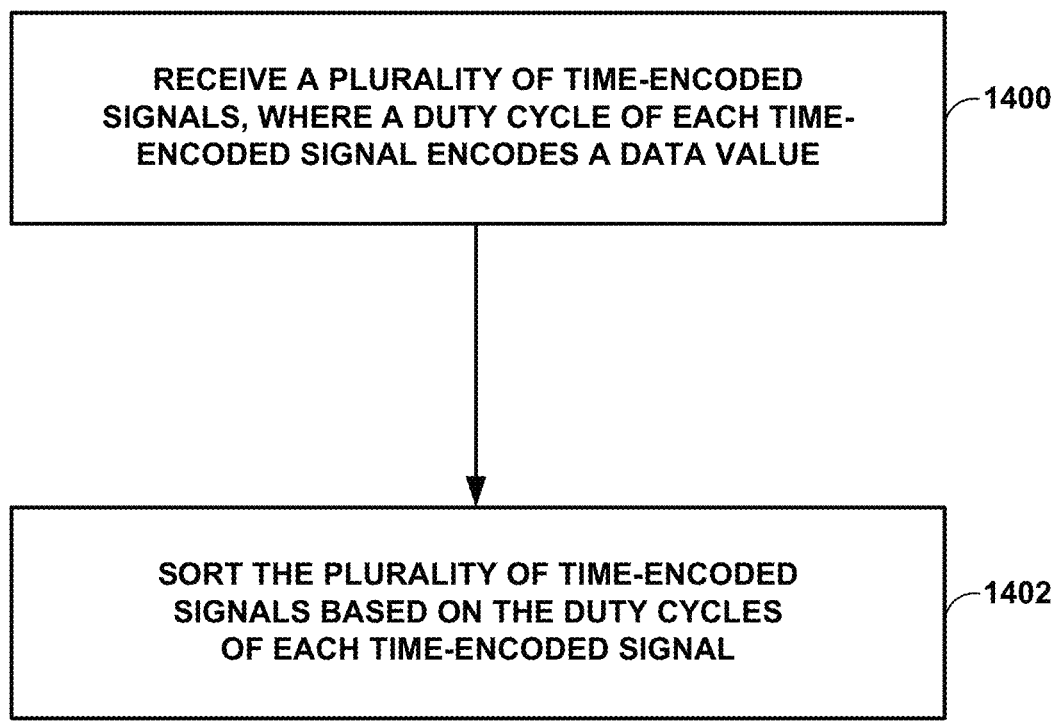
FIG. 14 is a flow diagram illustrating example techniques for sorting input values using time-encoded signals.

FIG. 14 is a flow diagram illustrating example techniques for sorting input values using time-encoded signals. The example techniques of FIG. 14 are described with reference to device 180 of FIG. 1, but other components such as sorting network 300 of FIG. 3 and compare-and-swap networks 900 and 100 of FIGS. 9 and 10, may also perform similar techniques.

In the example of FIG. 14, sorting network 100 receives time-encoded signals 110 (1400). The duty cycle of each of time-encoded signals 110 encodes a data value, for example, based on the percentage of time that the respective signal has a high value. Each of time-encoded signals 110 may be a PWM signal or a thermometer-, unary-, and/or deterministically encoded signal.

In the example of FIG. 14, sorting network 100 sorts time-encoded signals 110 based on the duty cycles of each of time-encoded signals 120 (1402). Sorting network 100 then outputs the sorted time-encoded signals 110 to a thresholding circuit or to a time-to-analog converter. Sorting network 110 may have much simpler circuitry, as compared to a binary sorting network.

Figure 15:
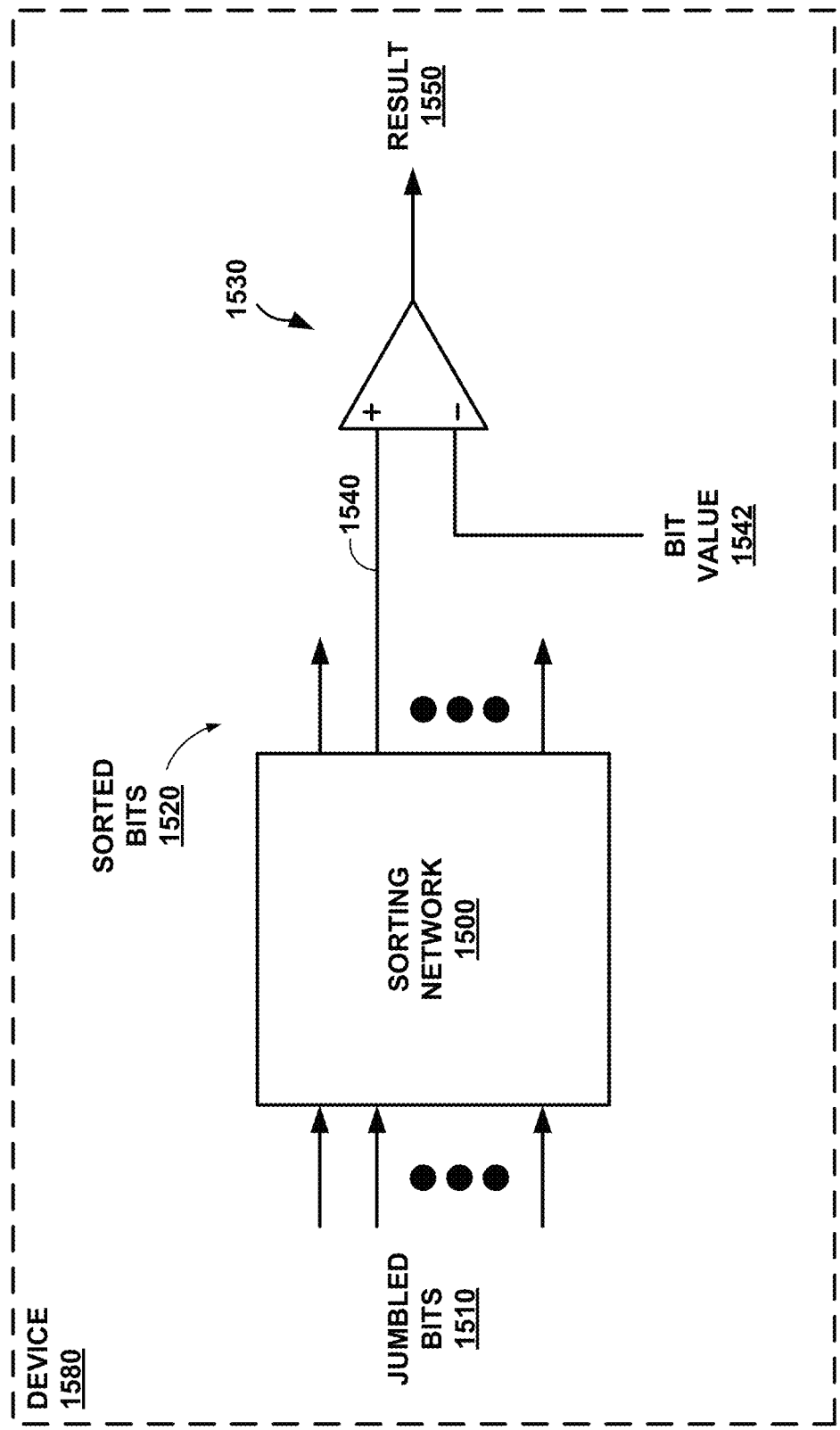
FIG. 15 is a conceptual block diagram showing an example sorting network and an example thresholding circuit.

FIG. 15 is a conceptual block diagram showing an example sorting network 1510 and an example thresholding circuit 1530, which are part of device 1580. In the example shown in FIG. 15, sorting network 1500 receives and converts jumbled bits 1510 to sorted bits 1520. Thresholding circuit 1530 is configured to receive and compare one or more of sorted bits 1520 to bit value 1542. Thresholding can be especially important for neural networks in image processing, such as the identification and classification of obstacles.

Thresholding circuit 1530 can apply more than one threshold to sorted bits 1520 by comparing a first bit of sorted bits 1520 to bit value 1542 and by comparing a second bit of sorted bits 1520 to bit value 1542. In such examples, threshold circuit 1530 may include more than one comparator. Thresholding circuit 1530 can output result 1550 to indicate whether both the first and second bits are greater than or equal to bit value 1542, only one of the first and second bits are greater than or equal to bit value 1542, or both the first and second bits are less than bit value 1542. Thus, result 1550 can indicate which range of values is encoded by jumbled bits 1510 and sorted bits 1520.

Thresholding circuit 1530 may be adjusted or programmed to select different bits for thresholding. Thus, thresholding circuit 1530 may be configured to apply different thresholds based on user input or a command received from another circuit. The threshold applied by thresholding circuit 1530 depends on which bit is selected from sorted bits 1520. If thresholding circuit 1530 selects a 10th percentile bit, thresholding circuit 1530 can determine whether the value encoded by sorted bits 1520 is greater or less than 0.1. If thresholding circuit 1530 selects a 20th percentile bit, thresholding circuit 1530 can determine whether the value encoded by sorted bits 1520 is greater or less than 0.2.

Figure 16:
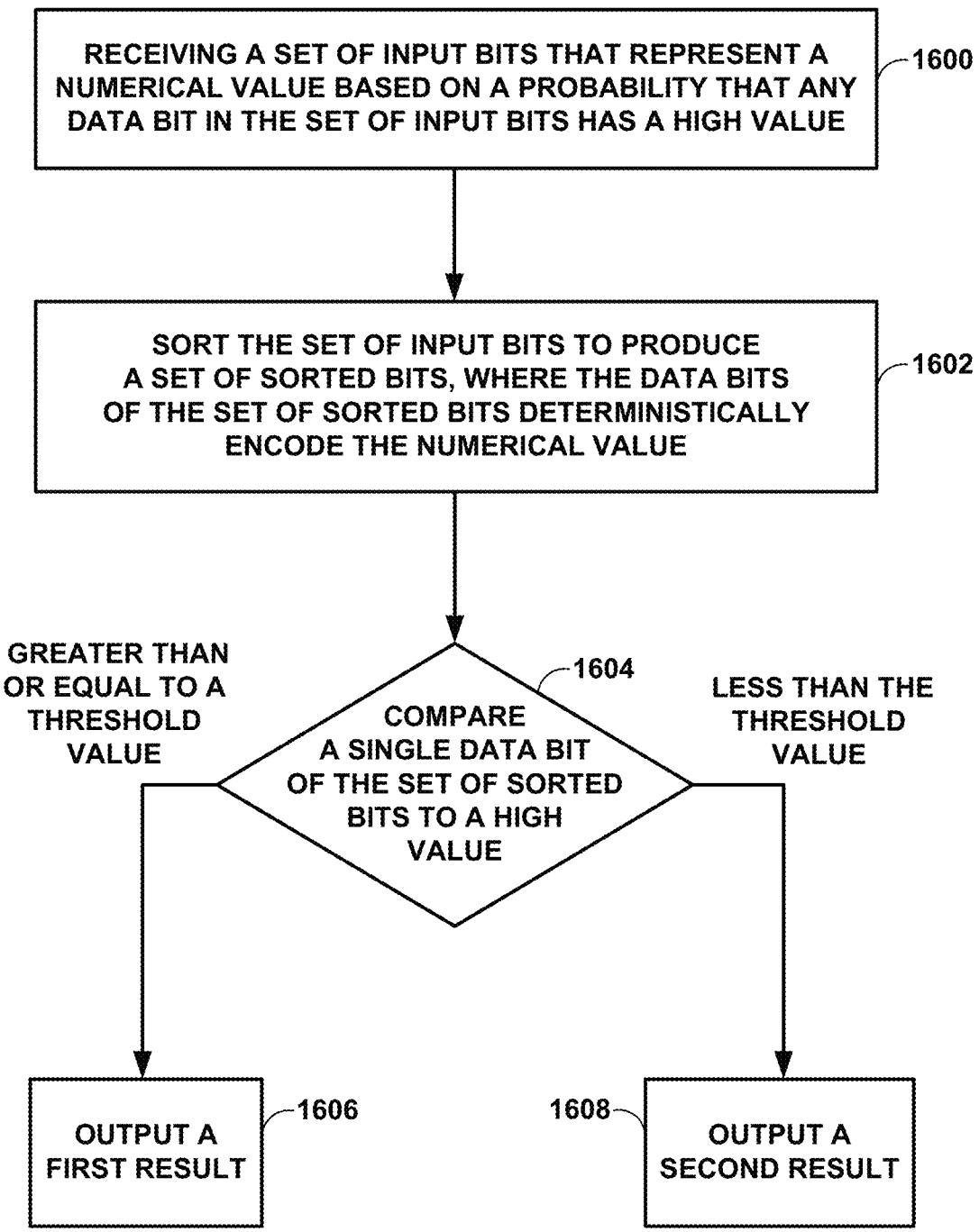
FIG. 16 is a flow diagram illustrating example techniques for sorting a set of input bits.

FIG. 16 is a flow diagram illustrating example techniques for sorting a set of input bits. The example techniques of FIG. 16 are described with reference to device 1580 of FIG. 15, but other components such as sorting network 300 of FIG. 3 and compare-and-swap networks 900 and 100 of FIGS. 9 and 10, may also perform similar techniques.

In the example of FIG. 16, sorting network 1500 receives jumbled bits 1510 that represent a numerical value based on a probability that any data bit in jumbled bits 1510 has a high value (1600). Jumbled bits 1510 may be a stochastic signal where the percentage of high bits to the total number of bits represents the encoded numerical value.

Sorting network 1500 sorts the set of input bits to produce sorted bits 1520 (1602). The data bits of sorted bits 1520 deterministically encode the same numerical value encoded by jumbled bits 1510. Sorted bits 1520 may have the same number of zeroes and ones as jumbled bits 1510, but the ones may be flushed left, so that all of the ones come first, followed by all of the zeroes. Alternatively the zeroes may be flushed left, so that all of the zeroes come first, followed by all of the ones.

Thresholding circuit 1530 can compare data bit 1540 to bit value 1542, which is an example of a threshold value (1604). In some examples, bit value 1542 is a high value or an intermediate value (e.g., between the high and low values of each data bit). In some examples, thresholding circuit 1530 is configured to output a low value only if data bit 1540 has a low value.

Responsive to determining that data bit 1540 has a high value, thresholding circuit 1530 outputs a first value for result 1550 indicating that the numerical value encoded by jumbled bits 1510 is greater than or equal to a threshold value (1606). Responsive to determining that data bit 1540 has a high value, thresholding circuit 1530 outputs a second value for result 1550 indicating that the numerical value encoded by jumbled bits 1510 is less than to the threshold value (1608). By selecting and thresholding only one data bit (e.g., data bit 1540), thresholding circuit 1530 can output result 1550 indicating whether the numerical value encoded by jumbled bits 1510 and sorted bits 1520 is above or below a threshold value. For example, if data bit 1540 is the 200th bit out of one thousand bits in sorted bits 1520, the result outputted by thresholding circuit 1530 indicates whether the numerical value encoded by jumbled bits 1510 is above or below a threshold value of 0.2.

By selecting and thresholding one or more bits from sorted bits 1520, thresholding circuit 1530 can output result 1550 indicating whether the encoded value is greater than a threshold value. Using sorting network 1500 and thresholding circuit 1530, device 1580 can efficiently threshold stochastic signals or non-unary signals (e.g., jumbled bits 1510).

Various examples have been described. These and other examples are within the scope of the following claims.

The invention claimed is:

1. A device including:
   a sorting network implemented in a hardware circuit configured to:
      receive a plurality of time-encoded signals, wherein each time-encoded signal of the plurality of time-encoded signals encodes a data value based on a duty cycle of the respective time-encoded signal or based on a proportion of data bits in the respective time-encoded signal that are high relative to the total data bits in the respective time-encoded signal; and
      sort the plurality of time-encoded signals based on the encoded data values of the plurality of time-encoded signals.

2. The device of claim 1,
   wherein the sorting network comprises a plurality of compare-and-swap blocks, and
   wherein each compare-and-swap block of the plurality of compare-and-swap blocks is configured to receive and sort two time-encoded signals of the plurality of time-encoded signals based on values encoded by the two time-encoded signals.

3. The device of claim 2, wherein each compare-and-swap block of the plurality of compare-and-swap blocks is configured to:
   compare the two time-encoded signals; and
   swap the two time-encoded signals based on comparing the two time-encoded signals.

4. The device of claim 2, wherein each compare-and-swap block of the plurality of compare-and-swap blocks comprises:
   a first circuit configured to output a first time-encoded signal of the two time-encoded signals that represents a larger data value; and
   a second circuit configured to output a second time-encoded signal of the two time-encoded signals that represents a smaller data value.

5. The device of claim 4,
   wherein the first circuit includes an OR gate, and
   wherein the second circuit includes an AND gate.

6. The device of claim 1, further comprising an analog-to-time converter configured to convert a first plurality of analog signals generated by a sensor to the plurality of time-encoded signals.

7. The device of claim 6, wherein the analog-to-time converter comprises:
   a ramp generator configured to convert an analog signal to a sawtooth signal or a triangle signal; and
   an analog comparator configured to convert the sawtooth signal or the triangle signal to a time-encoded signal.

8. The device of claim 1, further comprising a time-to-analog converter configured to convert time-encoded signals outputted by the sorting network to a second plurality of analog signals.

9. The device of claim 1, wherein each time-encoded signal of the plurality of time-encoded signals comprises a time-encoded pulse signal or a pulse-width modulated signal.

10. The device of claim 1,
wherein each time-encoded signal of the plurality of time-encoded signals encodes a respective data value as a function of the duty cycle of a clock cycle, and
wherein each time-encoded signal includes a high phase and a low phase during each clock cycle.

11. The device of claim 1, wherein the sorting network is part of an artificial neural network.

12. The device of claim 1, further comprising a thresholding circuit configured to:
receive a single time-encoded signal of the plurality of time-encoded signals outputted by the sorting network;
output a first result in response to determining that encoded data value of the single time-encoded signal is greater than or equal to a threshold value; and
output a second result in response to determining that the encoded data value is less than the threshold value.

13. A method comprising:
receiving, with circuitry, a plurality of time-encoded signals, wherein each time-encoded signal of the plurality of time-encoded signals encodes a data value based on a duty cycle of the respective time-encoded signal or based on a proportion of data bits in the respective time-encoded signal that are high relative to the total data bits in the respective time-encoded signal; and
sorting, with the circuitry, the plurality of time-encoded signals based on the encoded data values of the plurality of time-encoded signals.

14. The method of claim 13, wherein sorting the plurality of time-encoded signals includes:
comparing two time-encoded signals of the plurality of time-encoded signals; and
swapping the two time-encoded signals based on comparing the two time-encoded signals.

15. The method of claim 13, further comprising outputting the plurality of time-encoded signals in a sorted order.

16. An electrical circuit device comprising:
a sorting network circuit configured to receive a set of input bits, wherein the data bits of the set of input bits represent a numerical value based on a probability that any data bit in the set of input bits is high,
wherein the sorting network circuit is further configured to sort the set of input bits to produce a set of sorted bits, wherein the data bits of the set of sorted bits deterministically encode the numerical value based on a proportion of the data bits in the set of sorted bits that are high relative to the total data bits in the set of sorted bits; and
a thresholding circuit configured to:
receive a single data bit of the set of sorted bits;
output a first result in response to determining that the numerical value is greater than or equal to a threshold value; and
output a second result in response to determining that the numerical value is less than the threshold value.

17. The electrical circuit device of claim 16,
wherein the sorting network comprises a plurality of compare-and-swap blocks to sort the set of input bits, and
wherein each compare-and-swap block of the plurality of compare-and-swap blocks is configured to receive two data bits of the set of input sets and sort the two data bits based on values of the two data bits.

18. The electrical circuit device of claim 17, wherein each compare-and-swap block of the plurality of compare-and-swap blocks comprises:
a first circuit configured to output a first data bit of the two data bits that represents a larger data value; and
a second circuit configured to output a second data bit of the two data bits that represents a smaller data value.

19. The electrical circuit device of claim 18,
wherein the first circuit includes an OR gate, and
wherein the second circuit includes an AND gate.

20. The electrical circuit device of claim 16, wherein the sorting network and thresholding circuit are part of an artificial neural network.

* * * * *